(12) United States Patent
Chiang et al.

(10) Patent No.: US 10,535,656 B2
(45) Date of Patent: Jan. 14, 2020

(54) HYBRID SCHEME FOR IMPROVED PERFORMANCE FOR P-TYPE AND N-TYPE FINFETS

(71) Applicant: Taiwan Semiconductor Manufacturing Company, Ltd., Hsinchu (TW)

(72) Inventors: Kuo-Cheng Chiang, Zhubei (TW); Shi Ning Ju, Hsinchu (TW); Ching-Wei Tsai, Hsinchu (TW); Kuan-Lun Cheng, Hsinchu (TW); Chih-Hao Wang, Baoshan Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/205,443

(22) Filed: Nov. 30, 2018

(65) Prior Publication Data

US 2019/0109136 A1 Apr. 11, 2019

Related U.S. Application Data

(62) Division of application No. 15/691,852, filed on Aug. 31, 2017, now Pat. No. 10,269,803.

(51) Int. Cl.
*H01L 27/092* (2006.01)
*H01L 21/308* (2006.01)
(Continued)

(52) U.S. Cl.
CPC .... *H01L 27/0924* (2013.01); *H01L 21/02532* (2013.01); *H01L 21/02636* (2013.01);
(Continued)

(58) Field of Classification Search
CPC ........... H01L 27/0924; H01L 21/76229; H01L 21/3081; H01L 21/76224; H01L 29/66545;
(Continued)

(56) References Cited

U.S. PATENT DOCUMENTS 9,299,721 B2 * 3/2016 Liu .................. H01L 21/845
10,163,731 B2 * 12/2018 Ching .............. H01L 21/845
(Continued)

FOREIGN PATENT DOCUMENTS

JP 2009200471 A 9/2009
KR 20150128532 A 11/2015

*Primary Examiner* — Victor A Mandala
(74) *Attorney, Agent, or Firm* — Slater Matsil, LLP

(57) ABSTRACT

A method includes etching a hybrid substrate to form a recess extending into the hybrid substrate. The hybrid substrate includes a first semiconductor layer having a first surface orientation, a dielectric layer over the first semiconductor layer, and a second semiconductor layer having a second surface orientation different from the first surface orientation. After the etching, a top surface of the first semiconductor layer is exposed to the recess. A spacer is formed on a sidewall of the recess. The spacer contacts a sidewall of the dielectric layer and a sidewall of the second semiconductor layer. An epitaxy is performed to grow an epitaxy semiconductor region from the first semiconductor layer. The spacer is removed.

20 Claims, 27 Drawing Sheets

(51) Int. Cl.
*H01L 27/12* (2006.01)
*H01L 21/84* (2006.01)
*H01L 21/762* (2006.01)
*H01L 21/02* (2006.01)
*H01L 21/306* (2006.01)
*H01L 21/311* (2006.01)
*H01L 21/8238* (2006.01)
*H01L 29/06* (2006.01)
*H01L 29/66* (2006.01)
*H01L 29/04* (2006.01)
*H01L 29/165* (2006.01)
*H01L 29/78* (2006.01)

(52) U.S. Cl.
CPC .... *H01L 21/3081* (2013.01); *H01L 21/30604* (2013.01); *H01L 21/31111* (2013.01); *H01L 21/76224* (2013.01); *H01L 21/76229* (2013.01); *H01L 21/823821* (2013.01); *H01L 21/845* (2013.01); *H01L 27/0922* (2013.01); *H01L 27/1207* (2013.01); *H01L 27/1211* (2013.01); *H01L 29/0649* (2013.01); *H01L 29/6653* (2013.01); *H01L 29/66545* (2013.01); *H01L 21/30625* (2013.01); *H01L 21/823807* (2013.01); *H01L 21/823828* (2013.01); *H01L 29/045* (2013.01); *H01L 29/165* (2013.01); *H01L 29/7848* (2013.01)

(58) Field of Classification Search
CPC ....... H01L 21/02636; H01L 21/823821; H01L 27/0922; H01L 29/045; H01L 29/0649; H01L 29/6653; H01L 21/02532; H01L 21/30604; H01L 21/31111; H01L 21/823828; H01L 29/165; H01L 29/7848; H01L 21/30625
See application file for complete search history.

(56) References Cited

U.S. PATENT DOCUMENTS

| | | | |
|---|---|---|---|
| 10,176,990 B2 * | 1/2019 | Kerber | H01L 29/66795 |
| 2007/0063306 A1 * | 3/2007 | Doyle | H01L 21/2022 |
| | | | 257/486 |
| 2008/0064160 A1 | 3/2008 | Kim et al. | |
| 2008/0079003 A1 * | 4/2008 | Shaheen | H01L 29/045 |
| | | | 257/64 |
| 2009/0159972 A1 | 6/2009 | Jakschik et al. | |
| 2010/0015778 A1 | 1/2010 | Lin et al. | |
| 2012/0175710 A1 | 7/2012 | Xiong et al. | |
| 2013/0175618 A1 | 7/2013 | Cheng et al. | |
| 2015/0325646 A1 | 11/2015 | Lai et al. | |
| 2015/0340381 A1 | 11/2015 | Ramachandran et al. | |
| 2016/0197077 A1 * | 7/2016 | Cheng | H01L 21/823821 |
| | | | 257/369 |
| 2016/0233242 A1 | 8/2016 | Doris et al. | |
| 2017/0053835 A1 * | 2/2017 | Sung | H01L 21/823821 |
| 2017/0053839 A1 * | 2/2017 | Cheng | H01L 29/6681 |
| 2018/0097001 A1 * | 4/2018 | Bi | H01L 29/4966 |
| 2018/0097002 A1 * | 4/2018 | Chu | H01L 21/82386 |
| 2018/0240716 A1 * | 8/2018 | Cheng | H01L 21/823892 |
| 2018/0301384 A1 * | 10/2018 | Ching | H01L 21/845 |
| 2018/0366465 A1 * | 12/2018 | Ching | H01L 29/045 |
| 2019/0006171 A1 * | 1/2019 | Dasgupta | H01L 21/8258 |

* cited by examiner

HYBRID SCHEME FOR IMPROVED PERFORMANCE FOR P-TYPE AND N-TYPE FINFETS

PRIORITY CLAIM AND CROSS-REFERENCE

This application is a divisional of U.S. patent application Ser. No. 15/691,852, entitled "Hybrid Scheme for Improved Performance for P-type and N-type FinFETs," filed on Aug. 31, 2017, now U.S. Pat. No. 10,269,803 issued on Apr. 23, 2019, which application is incorporated herein by reference.

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. In conventional FinFET formation processes, the semiconductor fins may be formed by forming trenches in a silicon substrate, filling the trenches with dielectric materials to form Shallow Trench Isolation (STI) regions, and then recessing the top portions of the STI regions. The silicon substrate portions between the recessed portions of the STI regions thus form semiconductor fins, on which the FinFETs are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
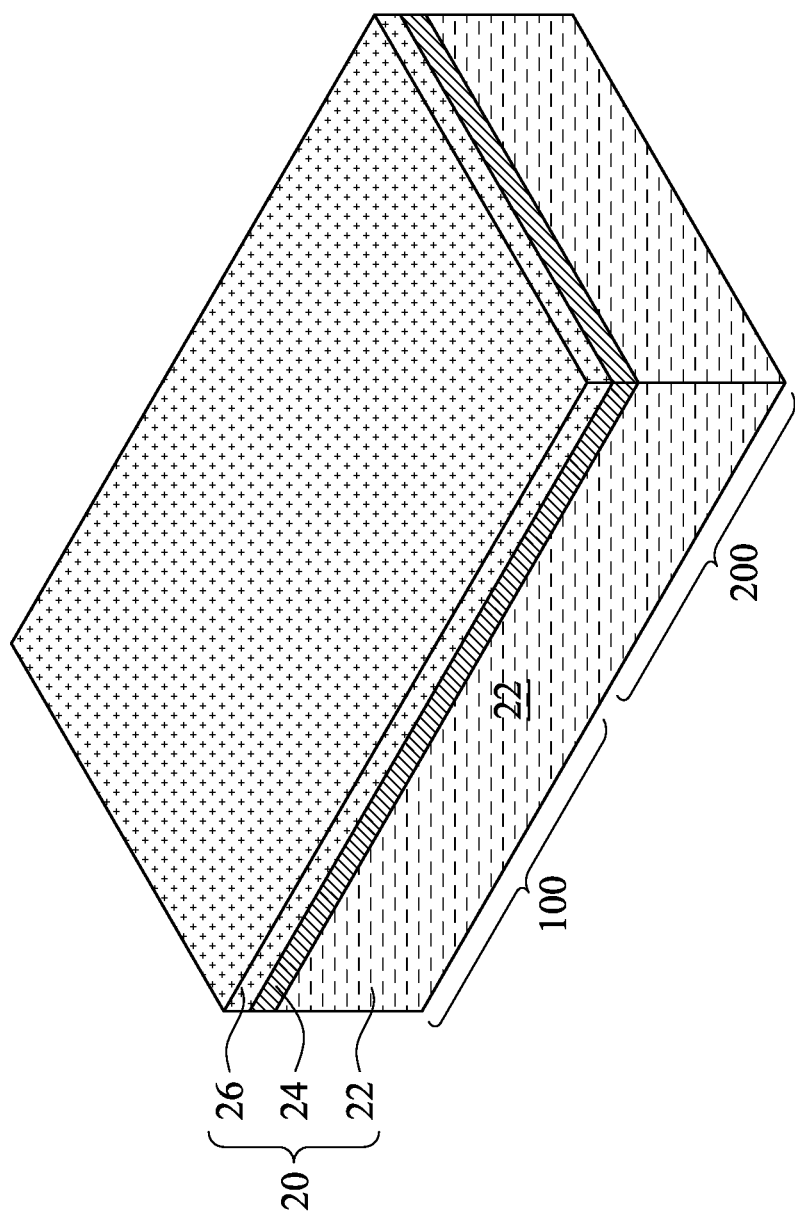
FIGS. 1 through 16 illustrate the cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Fin Field-Effect Transistors (FinFETs) on a hybrid substrate and the resulting structures are provided in accordance with various exemplary embodiments. The intermediate stages of forming the hybrid substrate and the FinFETs are illustrated in accordance with some embodiments. Some variations of some embodiments are discussed. Throughout the various views and illustrative embodiments, like reference numbers are used to designate like elements.

Figure 18:
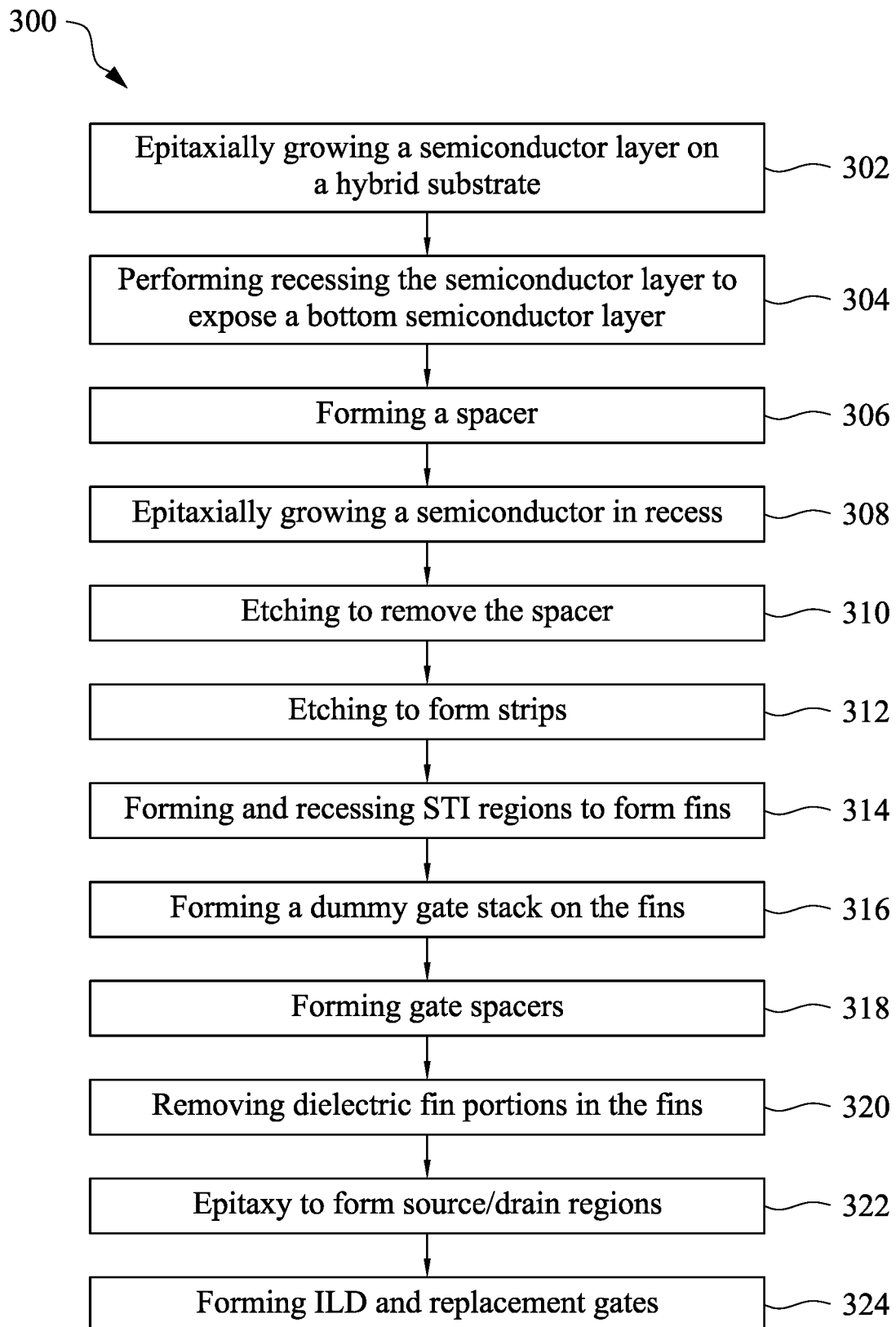
FIG. 18 illustrates a process flow for forming FinFETs in accordance with some embodiments.

FIGS. 1 through 16 illustrate the cross-sectional views and perspective view of intermediate stages in the formation of the hybrid substrate and the FinFETs in accordance with some embodiments of the present disclosure. The steps shown in FIGS. 1 through 16 are also reflected schematically in the process flow 300 shown in FIG. 18.

Referring to FIG. 1, hybrid substrate 20 is provided. Hybrid substrate 20 includes crystalline silicon layer 22, dielectric layer 24 over silicon layer 22, and crystalline silicon layer 26 over dielectric layer 24. Dielectric layer 24 may be formed of silicon oxide or other dielectric materials such as silicon nitride, silicon carbide, etc. The thickness of dielectric layer 24 may be in the range between about 5 nm and about 15 nm, and different thicknesses may be adopted. One of ordinary skill in the art will realize that the dimensions recited throughout the description are merely examples, and may be changed to different values. Silicon layer 26 is bonded to dielectric layer 24. Hybrid substrate 20 includes a first portion in n-type device region 100, and a second portion in p-type device region 200.

Silicon layer 22 is a (100) substrate having a (100) surface orientation, with the top surface of silicon layer 22 in the (100) plane of silicon. In accordance with some embodiments, silicon substrate 26 is a (110) substrate having a (110) surface orientation, with the top surface of silicon layer in the (110) plane of silicon. In accordance with alternative embodiments of the present disclosure, silicon substrate 26 is a (100) R45 layer, which is formed by rotating a (100) substrate by 45 degrees before cutting and bonding to dielectric layer 24. As a result, the top surface of the (100) R45 layer has a (100) R45 surface orientation, and the sidewalls of the resulting fins (discussed referring to FIG. 7B) are also on the (100) plane of silicon.

Figure 2:
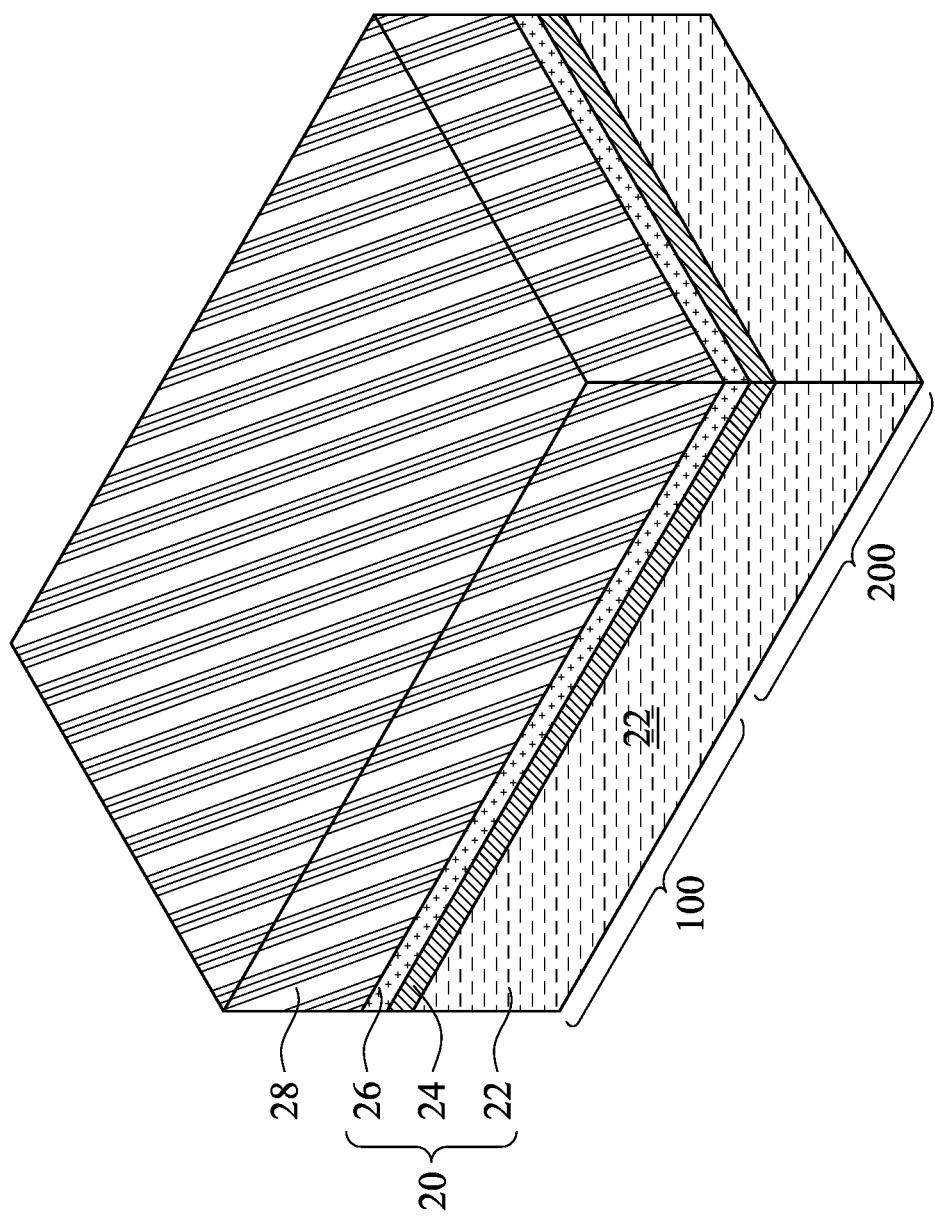

Referring to FIG. 2, an epitaxy is performed to grow silicon layer 28 on silicon layer 26. The respective step is shown as step 302 in the process flow shown in FIG. 18. Depending on the orientation of silicon layer 26, silicon layer 28 may be a (110) layer with the top surface being on the (110) plane of silicon, or may be a (100) R45 layer. Silicon layer 28 may be free from germanium. Furthermore, silicon layer 28 may be intrinsic, with no p-type and n-type impurity doped in the epitaxy. In accordance with alternative embodiments, silicon layer 28 is in-situ doped with a p-type impurity during the epitaxy. The thickness of silicon layer 28 may be close the fin height of the resulting FinFETs.

Figure 3:
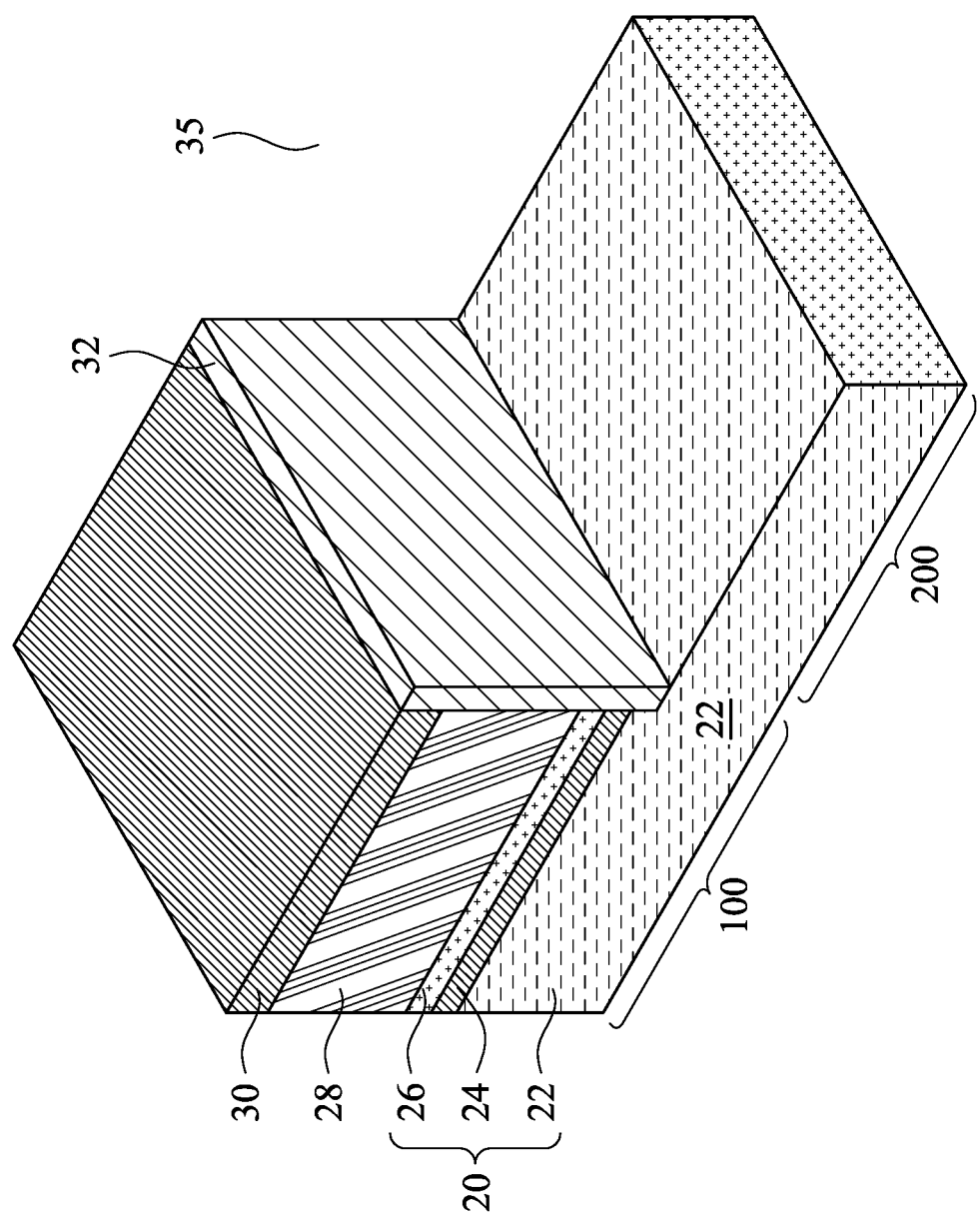

FIG. 3 illustrates the recessing of silicon layer 28 and hybrid substrate 20 in p-type device region 200, and the recessing is not performed in the n-type device region 100. The respective step is shown as step 304 in the process flow shown in FIG. 18. Recess 35 is thus formed. In accordance with some embodiments of the present disclosure, to perform the recessing, capping layer 30 is formed first as a blanket planar layer, for example, through thermal oxidation or deposition. Capping layer 30 may be formed of silicon oxide or other dielectric materials such as silicon nitride, silicon carbide, or silicon oxynitride. The recessing is then performed. During the recessing, capping layer 30, silicon layer 28, and silicon layer 26 are etched-through, exposing the top surface of the underlying dielectric layer 24, which is then etched. Silicon layer 22, which has the (100) surface plane, is thus exposed.

Next, a spacer layer is deposited, followed by an anisotropic etch to remove the horizontal portions of the spacer layer, so that spacer 32 is formed. The respective step is shown as step 306 in the process flow shown in FIG. 18. The spacer layer is formed of a material different from the material of capping layer 30. In accordance with some embodiments of the present disclosure, spacer 32 is formed of a dielectric material such as aluminum oxide ($Al_2O_3$), silicon nitride, or the like. Due to the different materials for forming capping layer 30 and spacer 32, capping layer 30 remains after the formation of spacer 32. Hence, both the sidewalls and the top surface of silicon layers 26 and 28 are masked.

Figure 4:
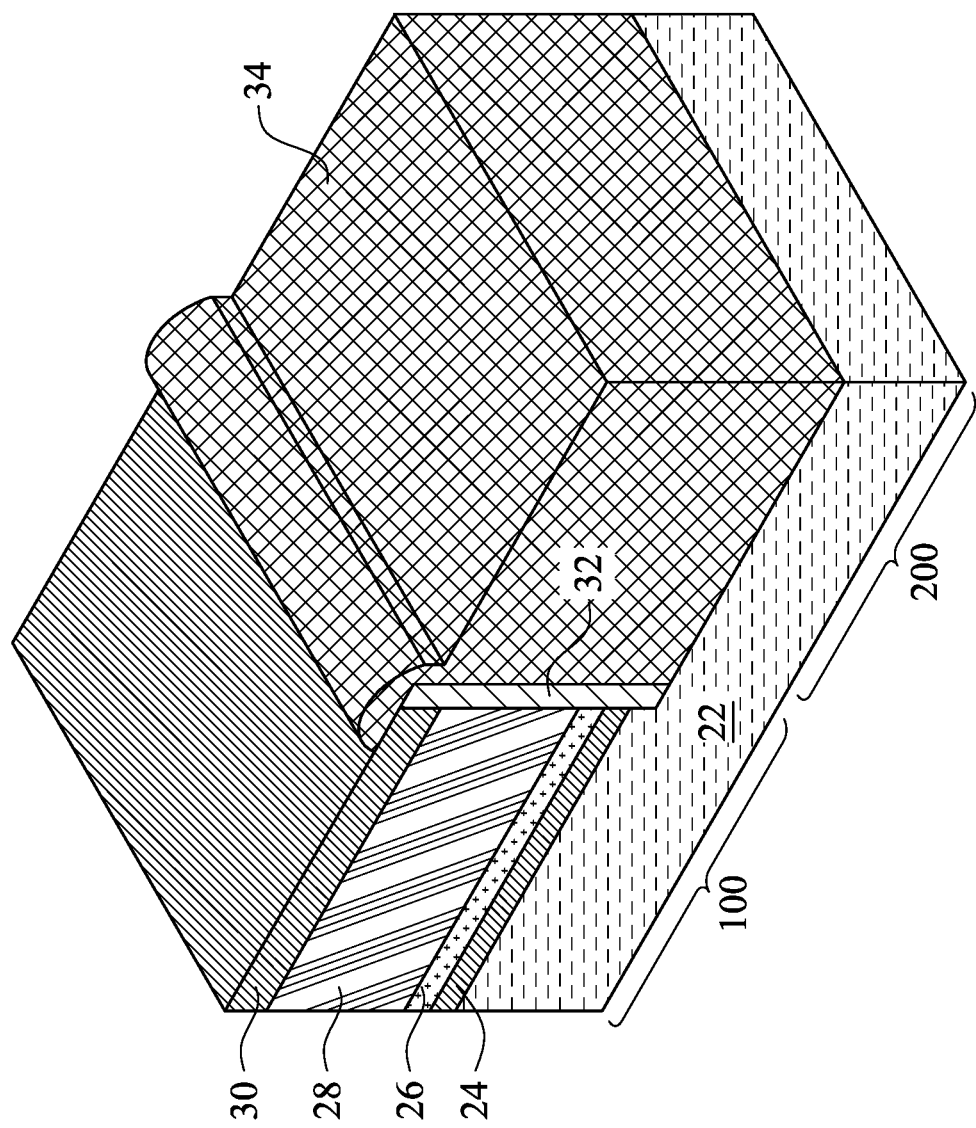

FIG. 4 illustrates the selective epitaxy of semiconductor layer 34. The respective step is shown as step 308 in the process flow shown in FIG. 18. In accordance with some embodiments of the present disclosure, semiconductor layer 34 is formed of a high-mobility semiconductor material such as silicon germanium, germanium (with no silicon), III-V compound semiconductor such as GaAs, InP, GaN, InGaAs, InAlAs, GaSb, AlSb, AlAs, AlP, GaP, combinations thereof, or multi-layers thereof. In the selective epitaxy, an etching gas such as HCl is added in the process gases, so that semiconductor layer 34 is grown from the top surface of silicon layer 22, and not from dielectric materials such as capping layer 30 and spacer 32. Spacer 32 masks the sidewalls of silicon layers 26 and 28, so that the epitaxy is achieved from a single surface (the top surface of silicon layer 22), and hence defects caused by growing from different surfaces are avoided. Since semiconductor layer 34 is epitaxially grown from silicon layer 22, it has the same surface orientation as silicon layer 22, and has the (100) surface orientation.

After the selective epitaxy of semiconductor layer 34, a planarization step such as Chemical Mechanical Polish (CMP) or mechanical grinding is performed to level the top surface of semiconductor layer 34. In accordance with some embodiments of the present disclosure, the planarization is performed using silicon layer 28 as a stop layer. In accordance with alternative embodiments of the present disclosure, the planarization is performed using capping layer 30 as a stop layer, followed by an etching process to remove capping layer 30.

Figure 5A:
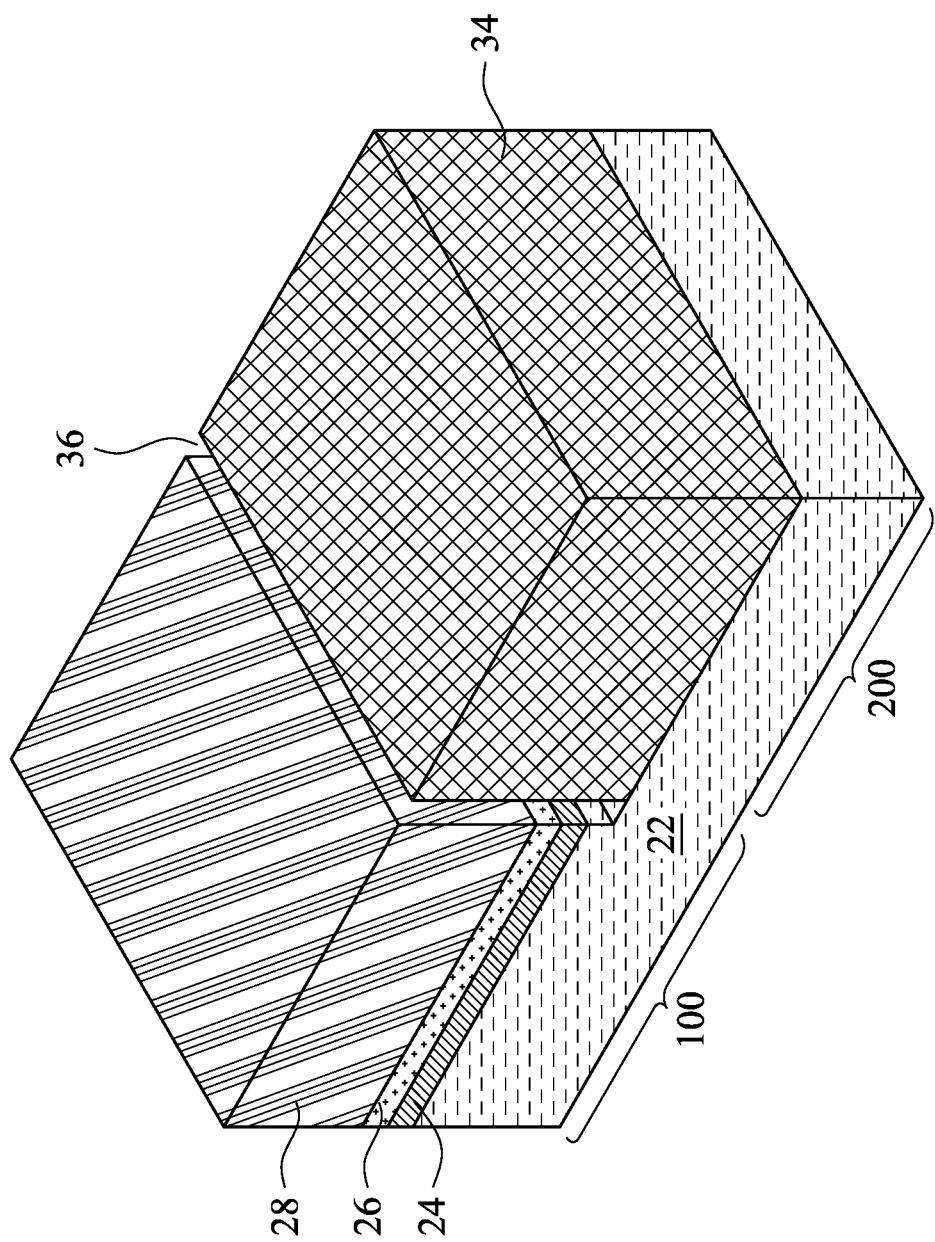
Figure 5B:
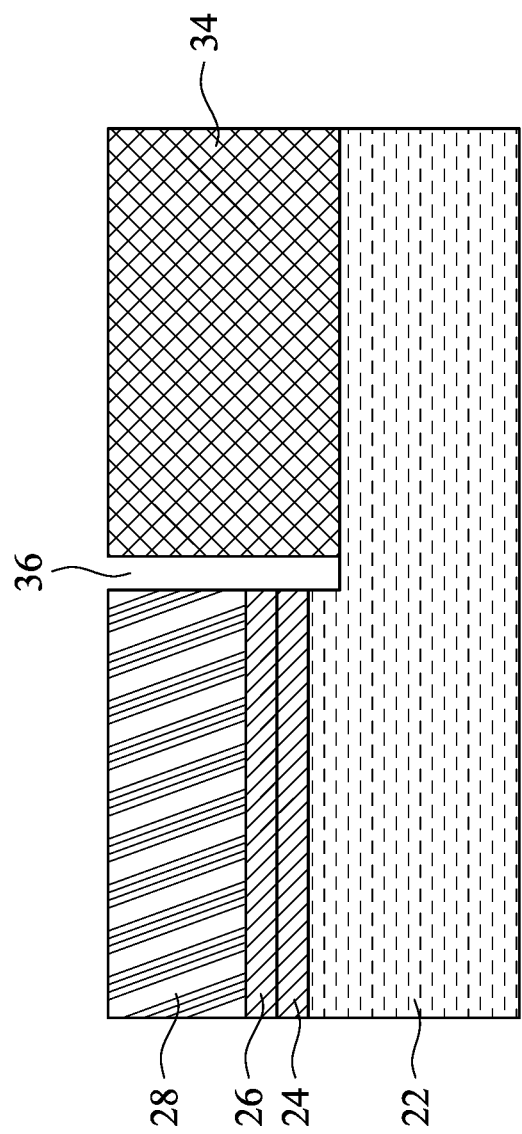

After the planarization, spacer 32 as shown in FIG. 4 is removed, and the resulting structure is shown in FIGS. 5A and 5B. The respective step is shown as step 310 in the process flow shown in FIG. 18. FIG. 5A illustrates a perspective view of the structure, and FIG. 5B illustrates a cross-sectional view of the structure. As shown in both FIGS. 5A and 5B, recess (gap) 36 is generated due to the removal of spacer layer 32, and recess 36 separates semiconductor layers 26 and 28 from semiconductor layer 34. In accordance with some embodiments of the present disclosure, spacer 32 is removed through a wet etch process. For example, when spacer 32 is formed of silicon nitride, the etching may be performed using phosphoric acid.

Figure 6:
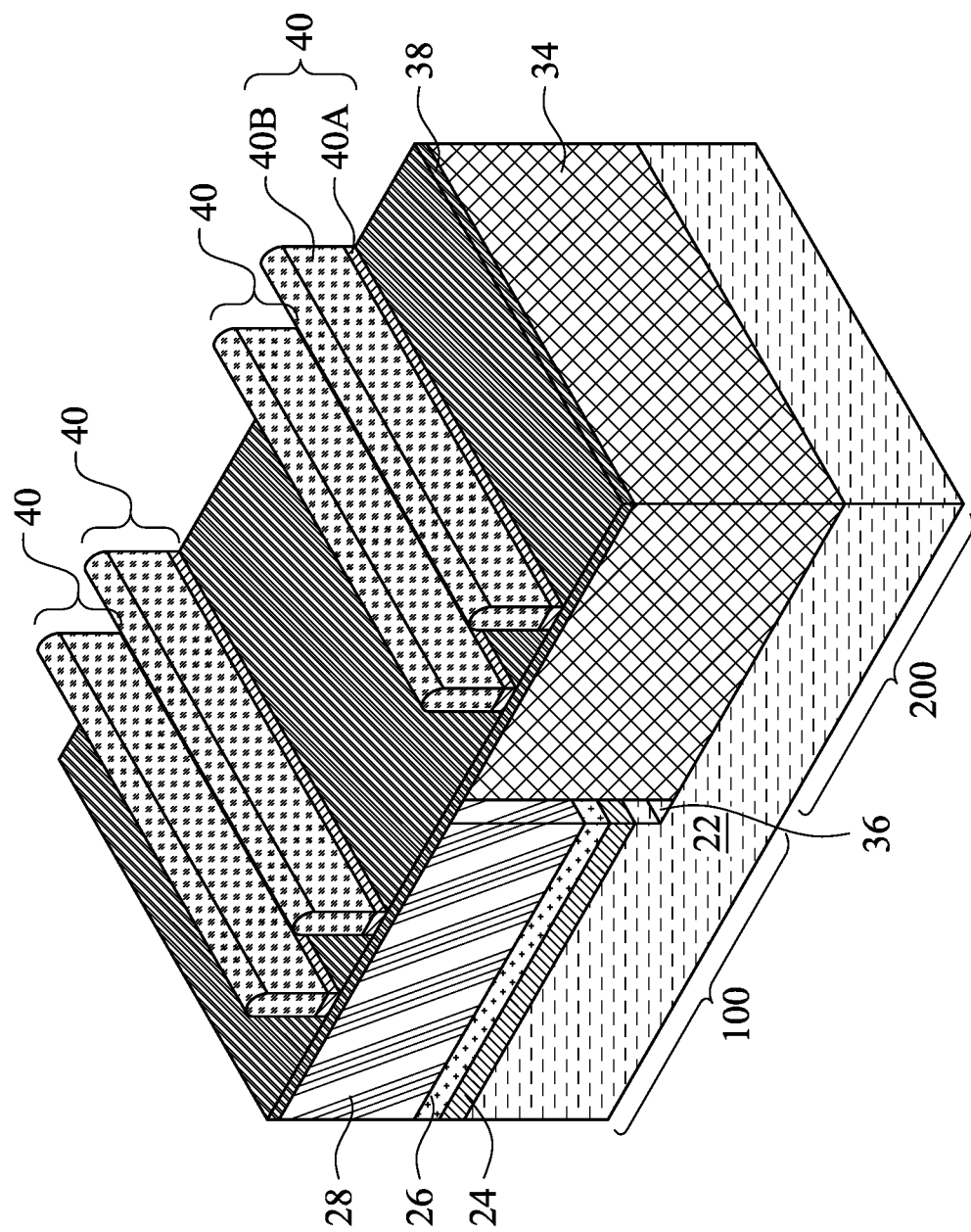

Referring to FIG. 6, protection layer 38 is formed. In accordance with some embodiments of the present disclosure, protection layer 38 is formed of silicon, and is deposited on the top surface the structure shown in FIG. 5A. Protection layer 38 is also free from germanium. The deposition may be achieved through an epitaxy process, so that the silicon layer is a crystalline layer. In accordance with alternative embodiments of the present disclosure, silicon layer 38 is a polysilicon layer. Protection layer 38 may form a bridge crossing over recess 36, while some deposited material of protection layer 38 may fall into recess 36.

Figure 7A:
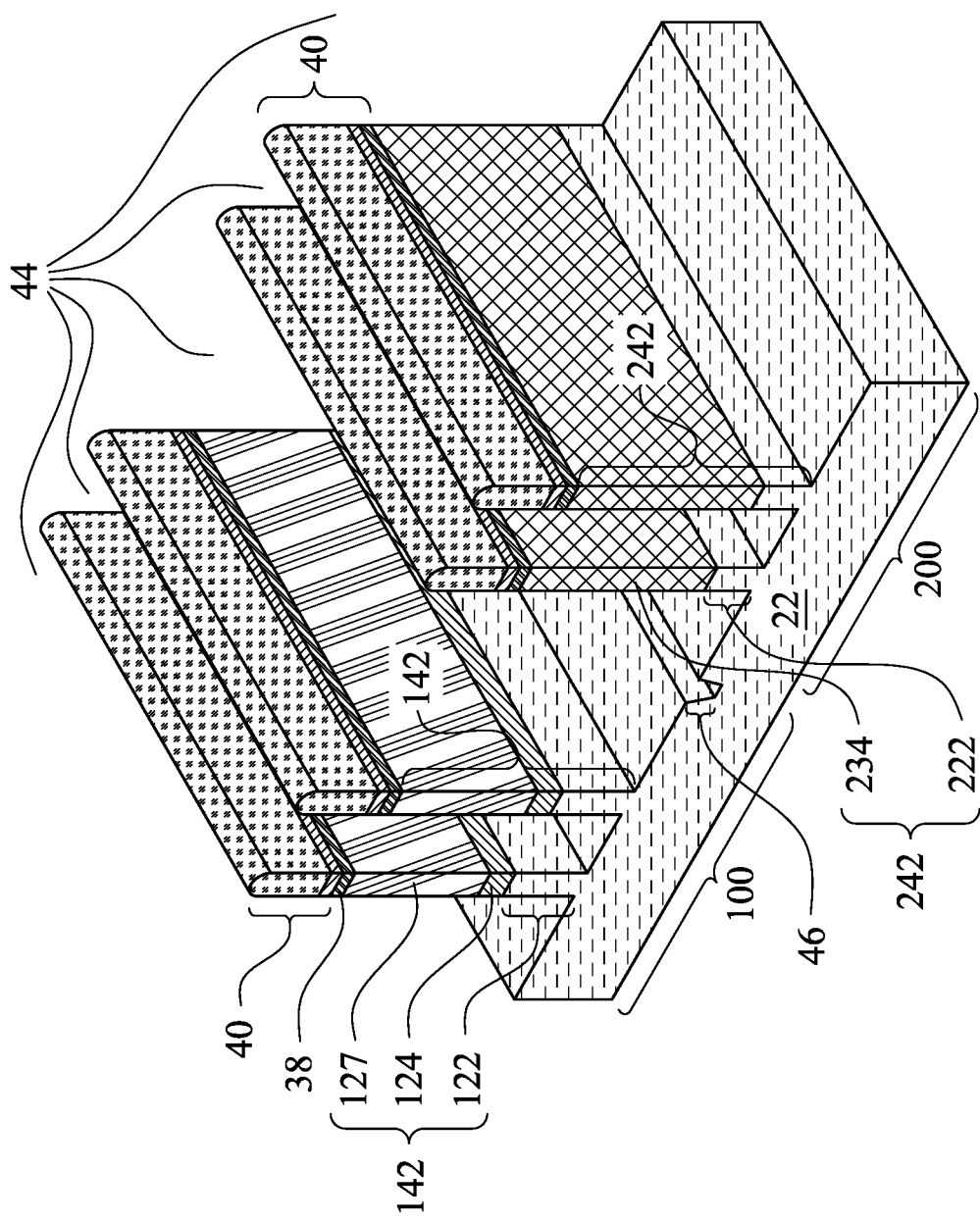
Figure 7B:
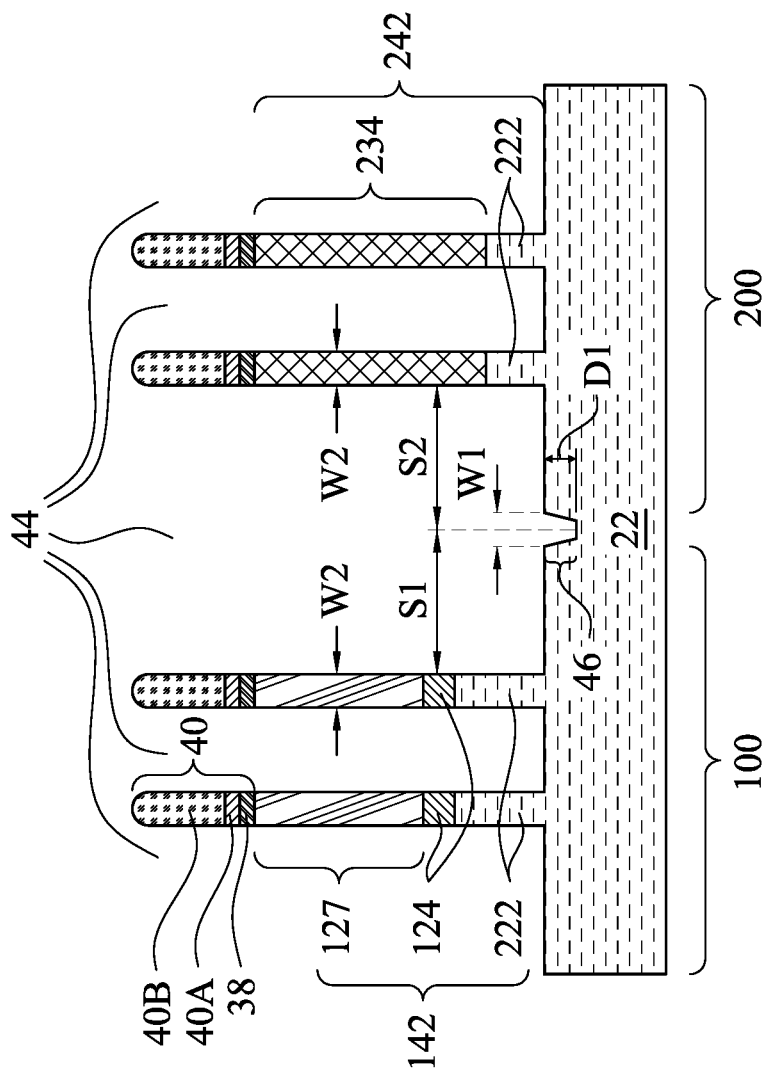

The following steps as shown in FIG. 6 and FIGS. 7A and 7B illustrate the formation of semiconductor strips. The strips may be patterned by any suitable method. For example, the strips may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the strips.

In accordance with some exemplary embodiments as shown in FIG. 6, mask layer(s) are deposited over protection layer 38, and are then patterned to form masks 40, which are used as etching mask for forming semiconductor strips. In accordance with some embodiments of the present disclosure, masks 40 include a plurality of layers formed of different materials. For example, masks 40 may include layers 40A formed of silicon oxide, and layers 40B over the respective layers 40, with layers 40B formed of silicon nitride. In the formation of masks 40, protection layer 38 protects the underlying semiconductor layer 34 from being oxidized, for example, due to the elevated temperature adopted in the deposition of the mask layers. Silicon germanium is prone to oxidation, and also has an oxidation rate significantly higher than the oxidation rate of silicon. Accordingly, by forming protection layer 38, semiconductor layer 34 is protected from the undesirable oxidation.

Referring to FIGS. 7A and 7B, an etching process is performed to etch the substrate and semiconductor layers, so that strips 142 and 242 are formed in n-type device region 100 and p-type device region 200, respectively. The respective step is shown as step 312 in the process flow shown in FIG. 18. Recesses 44 are formed to separate strips 142 and 242. Strips 142 include portions 122, 124, and 127. Strip portions 122 are the remaining portions of the patterned silicon layer 22. Strip portions 124 are the remaining portions of dielectric layer 24 (FIG. 6). Strip portions 127 are the remaining portions of silicon layers 26 and 28 (FIG. 6). In accordance with some embodiments of the present disclosure, silicon layers 26 and 28 (FIG. 6) have the (110) top surface orientation. Accordingly, strip portions 127 also have the (110) top surface orientation. In accordance with some embodiments of the present disclosure, silicon layers 26 and 28 are (100) R45 layers. Accordingly, both the top surface and sidewalls of strips 142 have (100) surface orientations. Strips 242 include portions 222 and 234. Strip portions 222 are the remaining portions of the patterned silicon layer 22. Strip portions 234 are the remaining portions of semiconductor layer 34 (FIG. 6). Accordingly, strip portions 234 also have (100) top surface orientation.

FIG. 7A illustrates a perspective view of the structure after the strip formation. FIG. 7B illustrates a cross-sectional view of the structure shown in FIG. 7A. In FIG. 7B, the illustrated top surface of strip portions 127 may be on a (100) surface plane or a (110) surface plane, and the left and right sidewalls of strip portions 127 are on (100) surface planes. The illustrated top surface of strip portions 234 may be on a (100) surface plane, and the left and right sidewall surfaces of strip portions 234 may be on (110) planes.

As also shown in FIGS. 7A and 7B, in the patterning for forming strips 142 and 242, the portions of silicon layer 22 directly under recess 36 (FIG. 6) is also etched, and hence notch 46 is formed to extend into silicon layer 22. Since the etching of silicon layer 22 through the deep and narrow recess 36 is slow, the notch has a depth D1 that is smaller than the thickness of semiconductor layer 34 (FIG. 6). In accordance with some embodiments, depth D1 (FIG. 7B) is in the range between about 5 nm and about 40 nm. The top width W1 of notch 46 may be in the range between about 3 nm and about 10 nm. Width W2 of strips 142 and 242 may be in the range between about 4 nm and about 6 nm. If viewed in a top view of FIGS. 7A and 7B, notch 46 and strips 142 and 242 are all elongated strips having lengthwise directions parallel to teach other.

Notch 46 may have an aspect ratio greater than about 0.5, and the aspect ratio may be in the range between about 0.5 and about 5.0 in accordance with some embodiment. The aspect ratio is affected, for example, by the depth of the depth and the width of recess 36. It is appreciated that although FIGS. 7A and 7B illustrate that notch 46 have straight sidewalls and a planar bottom, the sidewalls and the bottom of notch 46 may be rounded. For example, the sidewalls of notch 46 may be continuously curved, and are connected to a curved bottom. The sidewalls of notch 46 may also be substantially straight, which are connected to a curved bottom. The notch 46 may also be faceted, and may have a U-shape cross-sectional view having straight edges and a planar bottom surface. The notch 46 may also be faceted having a V-shape cross-sectional view. Other shapes are also contemplated.

As shown in FIGS. 4 through 7A and 7B, if spacer 32 (FIG. 4) is not removed before the formation of the protection layer and masks, in the patterning step as shown in FIGS. 7A and 7B, spacer 32 will be left, and will also protect the underlying portion of silicon layer 22, so that a narrow and high strip including spacer 32 and the underlying portion of silicon layer 22 will be formed. This strip may collapse in the subsequent process such as the formation of Shallow Trench Isolation (STI) regions 50 (FIG. 9), and hence cause defects. In accordance with some embodiments of the present disclosure, the removal of the spacer avoids the generation of the defects. As a result, notch 46 is formed at the interface region between n-type device region 100 and p-type device region 200. In accordance with some embodiments of the present disclosure, notch 46 is in the middle of strips 142 and 242, for example, with distances S1 and S2 having a difference smaller than about 20 percent, or smaller than about 10 percent of either of distances S1 and S2. With notch 46 being in the middle of strips 142 and 242, both S1 and S2 may be kept minimal while still leaving adequate spacing between p-type and n-type FinFETs, and hence the density of the resulting FinFETs may be maximized.

Figure 8:
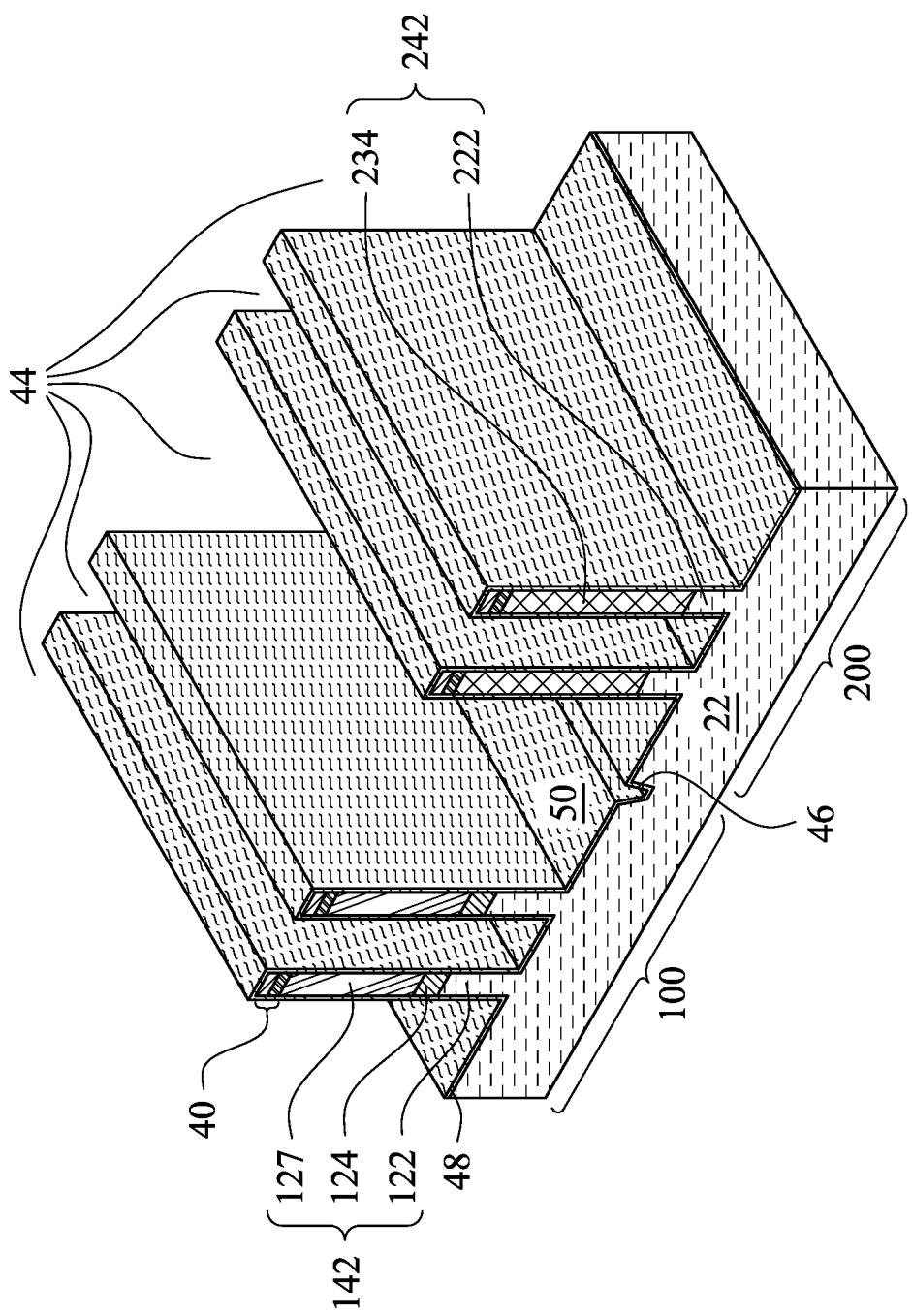

FIG. 8 illustrates the formation of first liner 48, which is used to mask the sidewalls of strip portions 234 from oxidation. In accordance with some embodiments of the present disclosure, liner 48 is formed of silicon, and is free from or substantially free from germanium (for example, with the germanium atomic percentage, if any, lower than about 5 percent). Furthermore, liner 48 may be free from oxygen and nitrogen, and hence does not include silicon oxide and silicon nitride. The formation of liner 48 may be performed using a conformal deposition method such as Atomic Layer Deposition (ALD) or Chemical Vapor Deposition (CVD). Liner 48 thus extends into recesses 44 and notch 46. Furthermore, liner 48 partially fills notch 46, and leaves a portion of notch 46 not filled.

Figure 9:
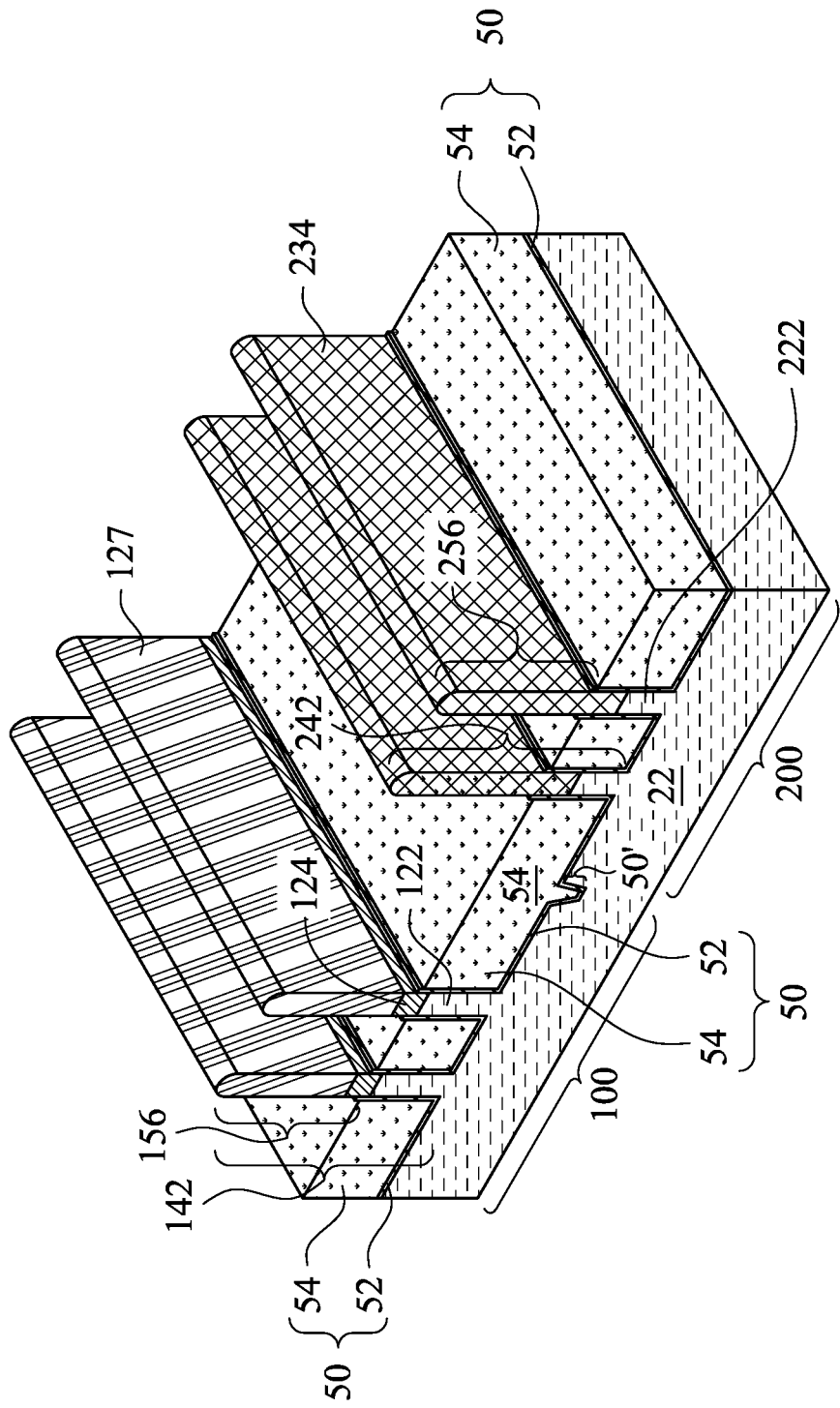

FIG. 9 illustrates the formation of STI regions 50, which includes dielectric liners 52 and dielectric regions 54 over dielectric liners 52. The respective step is shown as step 314 in the process flow shown in FIG. 18. In accordance with some embodiments of the present disclosure, a conformal deposition method is used to deposit a conformal dielectric liner 52 on the exposed surfaces of the structure shown in FIG. 8. For example, dielectric liners 52 may be formed using ALD or CVD. Next, the remaining portions of recesses 44 (FIG. 8) are filled with dielectric material 54. Dielectric material 54 may be formed using Flowable Chemical Vapor Deposition (FCVD), spin-on coating, or the like. In accordance with some embodiments in which FCVD is used, a silicon- and nitrogen-containing precursor (for example, trisilylamine (TSA) or disilylamine (DSA)) is used, and hence the resulting dielectric material is flowable (jelly-like). In accordance with alternative embodiments of the present disclosure, the flowable dielectric material is formed using an alkylamino silane based precursor. During the deposition, plasma is turned on to activate the gaseous precursors for forming the flowable oxide.

In the formation of dielectric liners 52 and dielectric regions 54, the temperature of the formation process may be elevated, which is likely to cause the oxidation of strip portions 234 if strip portions 234 are exposed. Liner 48 (FIG. 8) thus protects strip portions 234 from the oxidation. As a result, liner 48, (or at least the portions of liner 48 contacting strip portions 124, 127, and 234) may be oxidized during the formation of dielectric liners 52 and dielectric regions 54, and hence is converted into a silicon oxide layer.

Next, a planarization such as CMP or mechanical grinding is performed on dielectric regions 54 and dielectric liners 52. The planarization may be performed using masks 40 (FIG. 8) as a stop layer. Next, masks 40 are removed, followed by recessing dielectric regions 54 and dielectric liners 52. The respective step is also shown as step 314 in the process flow shown in FIG. 18. The resulting structure is shown in FIG. 9. The remaining portions of dielectric regions 54 and dielectric liners 52 are referred to as STI regions 50. In accordance with some embodiments of the present disclosure, the recessing is performed until the recessed STI regions 50 have their top surfaces lower than the top surfaces of dielectric strip portions 124, so that the sidewalls of dielectric strip portions 124 have at least some portions exposed. In accordance with alternative embodiments of the present disclosure, the recessed STI regions 50 have their top surfaces level with, higher than, or lower than the bottom surfaces of dielectric strip portions 124. Throughout the description, the portions of strips 142 and 242 higher than the top surfaces of STI regions 50 are referred to as fins (or protruding fins) 156 and 256. Notch 46 (FIG. 8) is filled with a downward protruding portion 50', which is a part of one of STI regions 50.

Figure 10:
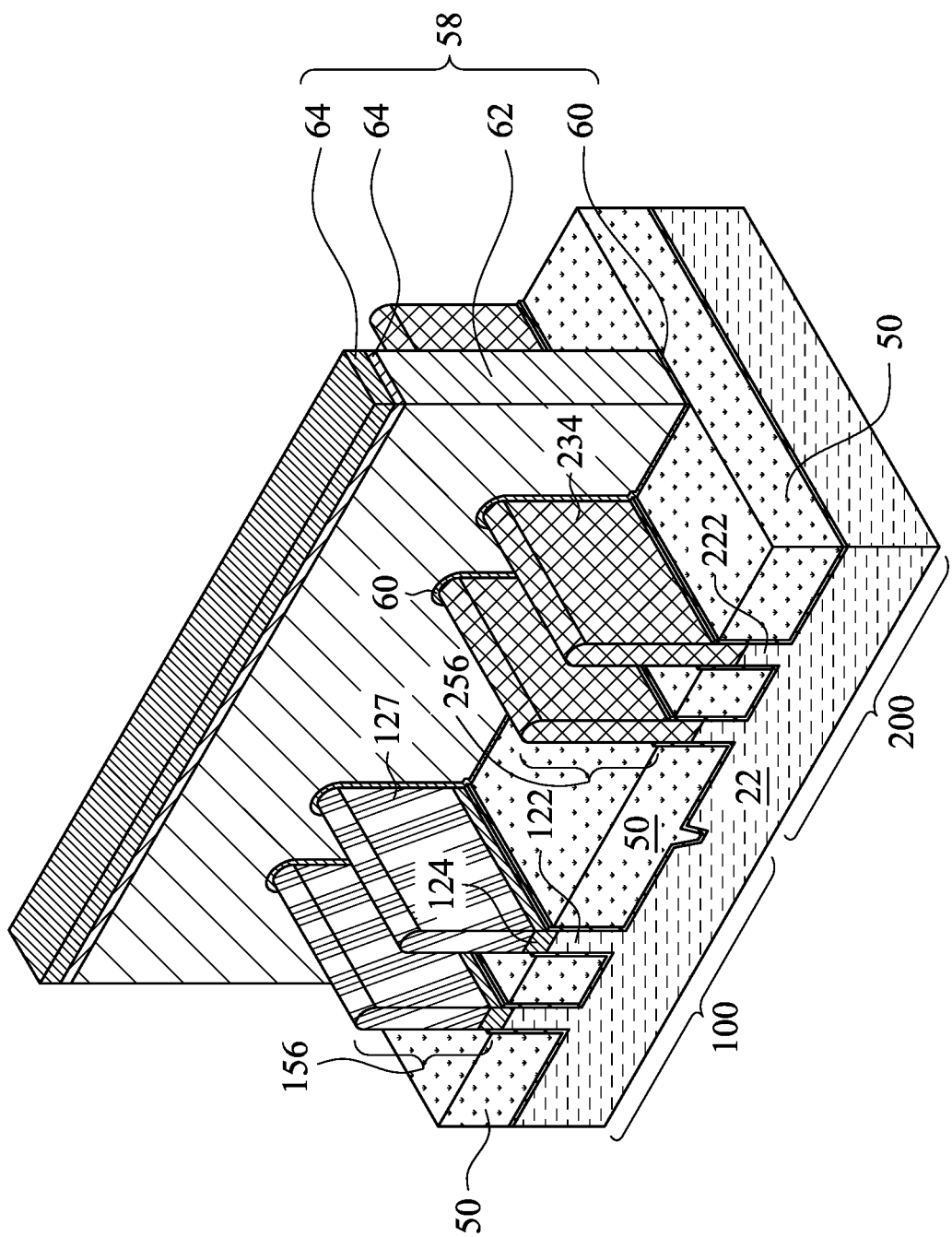

Referring to FIG. 10, dummy gate stack 58 is formed on the top surfaces and the sidewalls of (protruding) fins 156 and 256. The respective step is shown as step 316 in the process flow shown in FIG. 18. It is appreciated that although one dummy gate stack 58 is illustrated for clarity, there may be a plurality of dummy gate stacks formed, which are parallel to each other, with the plurality of dummy gate stacks crossing the same semiconductor fin(s) 156 and 256. Dummy gate stack 58 may include dummy gate dielectric 60 and dummy gate electrode 62 over dummy gate dielectric 60. Dummy gate electrode 62 may be formed, for example, using polysilicon, and other materials may also be used. Dummy gate stack 58 may also include one (or a plurality of) hard mask layer 64 over dummy gate electrode 62. Hard mask layer 64 may be formed of silicon nitride, silicon carbo-nitride, or the like. Dummy gate stack 58 may cross over a single one or a plurality of protruding fins 156 and 256 and/or STI regions 50. Dummy gate stack 58 also has a lengthwise direction perpendicular to the lengthwise directions of protruding fins 156 and 256.

Figure 11:
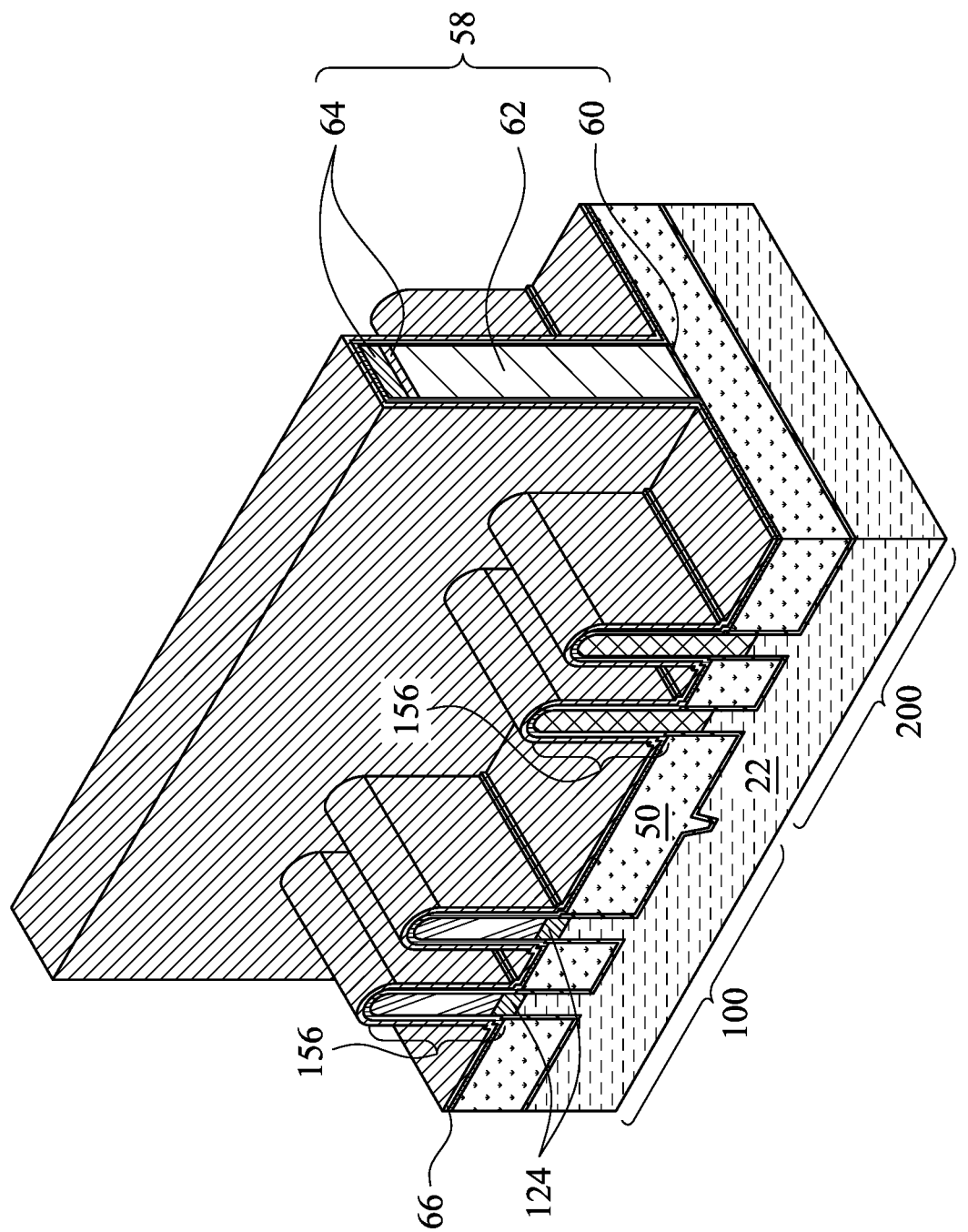

Next, referring to FIG. 11, spacer layer 66 is deposited. In accordance with some embodiments of the present disclosure, spacer layer 66 is formed of a dielectric material such as silicon nitride, silicon carbon-oxyitride (SiCN), or the like, and may have a single-layer structure or a multi-layer structure including a plurality of dielectric layers. The formation may be performed through a conformal deposition method such as ALD or CVD.

Figure 12:
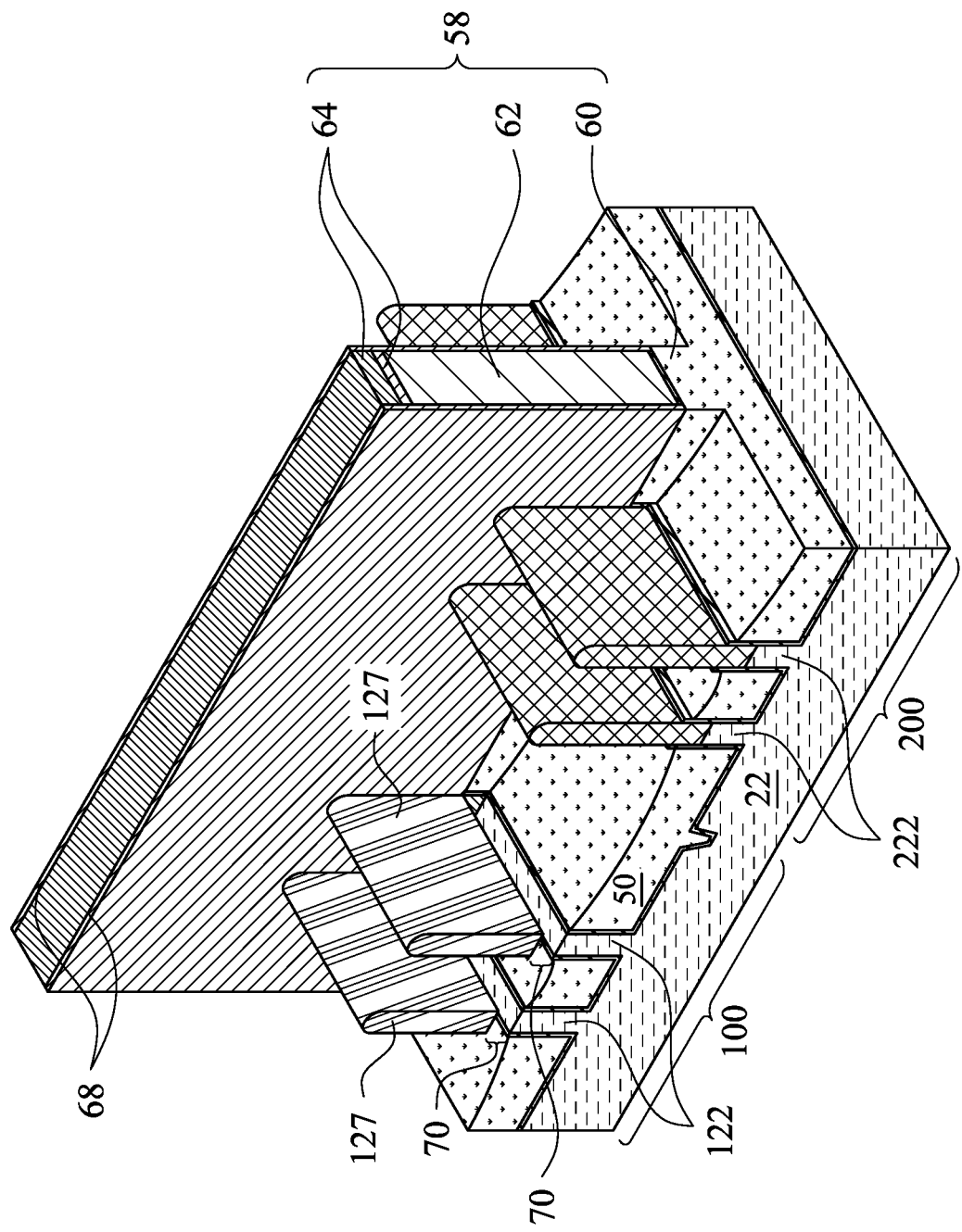

FIG. 12 illustrates the etching of spacer layer 66, resulting in the formation of gate spacers 68 on the sidewalls of dummy gate stack 58. The respective step is shown as step 318 in the process flow shown in FIG. 18. The etching is performed anisotropically, so that the portions of spacer layer on protruding fins 156 and 256 are removed. After the etching for forming gate spacers 68, some sidewalls of dielectric strip portions 124 (FIG. 11) are exposed. In accordance with some embodiments of the present disclosure, an isotropic etching is performed to etch dielectric strip portions 124, while the semiconductor portions of protruding fins 156 and 256 and spacers 68 are not etched. The respective step is shown as step 320 in the process flow shown in FIG. 18. In accordance with some embodiments of the present disclosure, the etching of dielectric strip portions 124 is performed through wet etching. For example, when dielectric strip portions 124 are formed of silicon oxide, an HF solution may be used as the etchant. After the etching of dielectric strip portions 124, gaps 70 are formed to separate strip portions 127 from the underlying strip portions 122. In accordance with alternative embodiments of the present disclosure, after the formation of gate spacers 68, at least some portions of dielectric strip portions 124 are left to separate fin portions 127 from strip portions 122.

After the etching of dielectric strip portions 124, there are still some portions of dielectric strip portions 124 remaining directly underlying dummy gate stack 58. These portions of dielectric strip portions 124 are not removed, and function to support the overlying strip portions 127 (referred to as semiconductor fins 127 hereinafter). Accordingly, the portions of fin portions 127 not directly underlying dummy gate stack 58 are suspended over gaps 70. The top surfaces of strip portions 122 are also exposed to gaps 70.

Figure 13A:
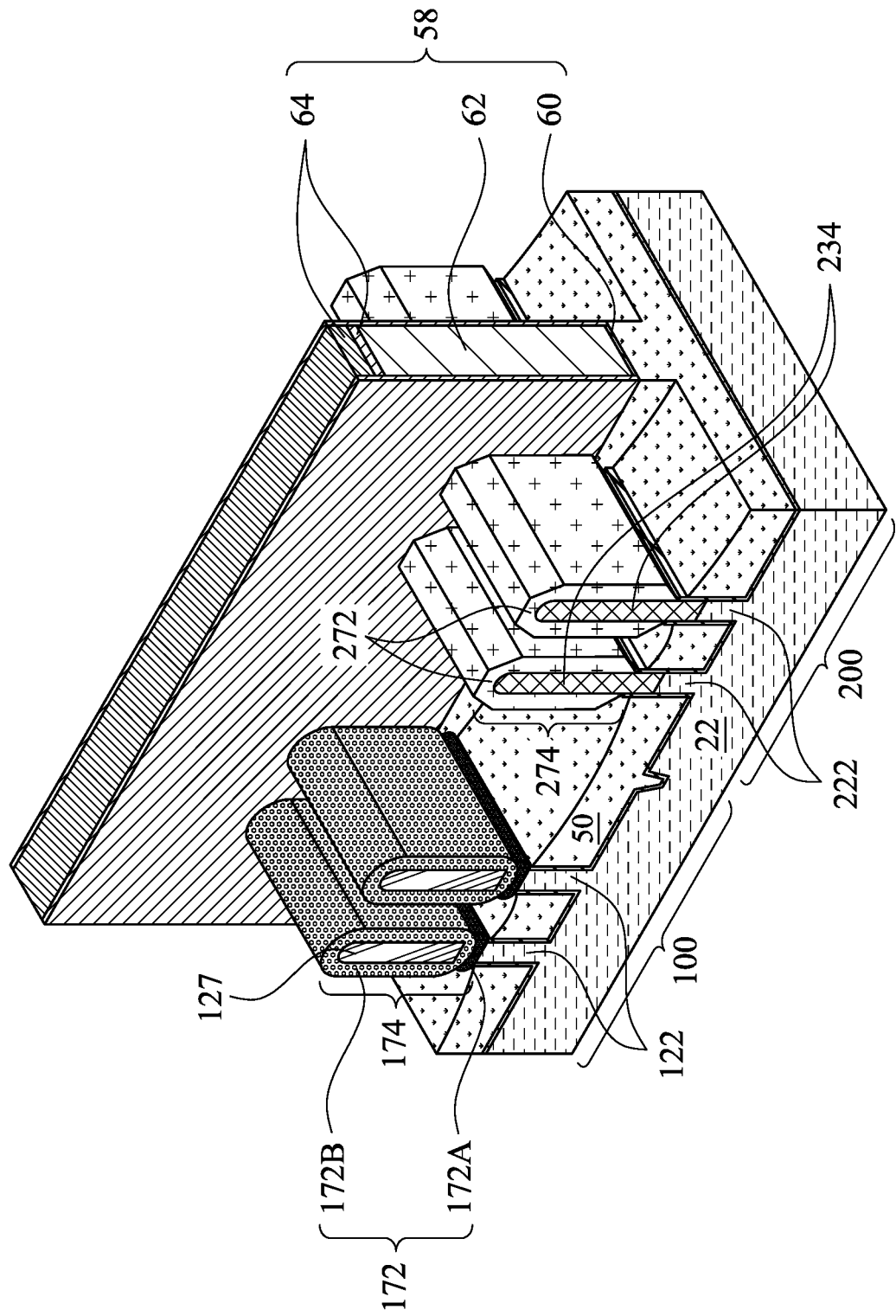
Figure 13B:
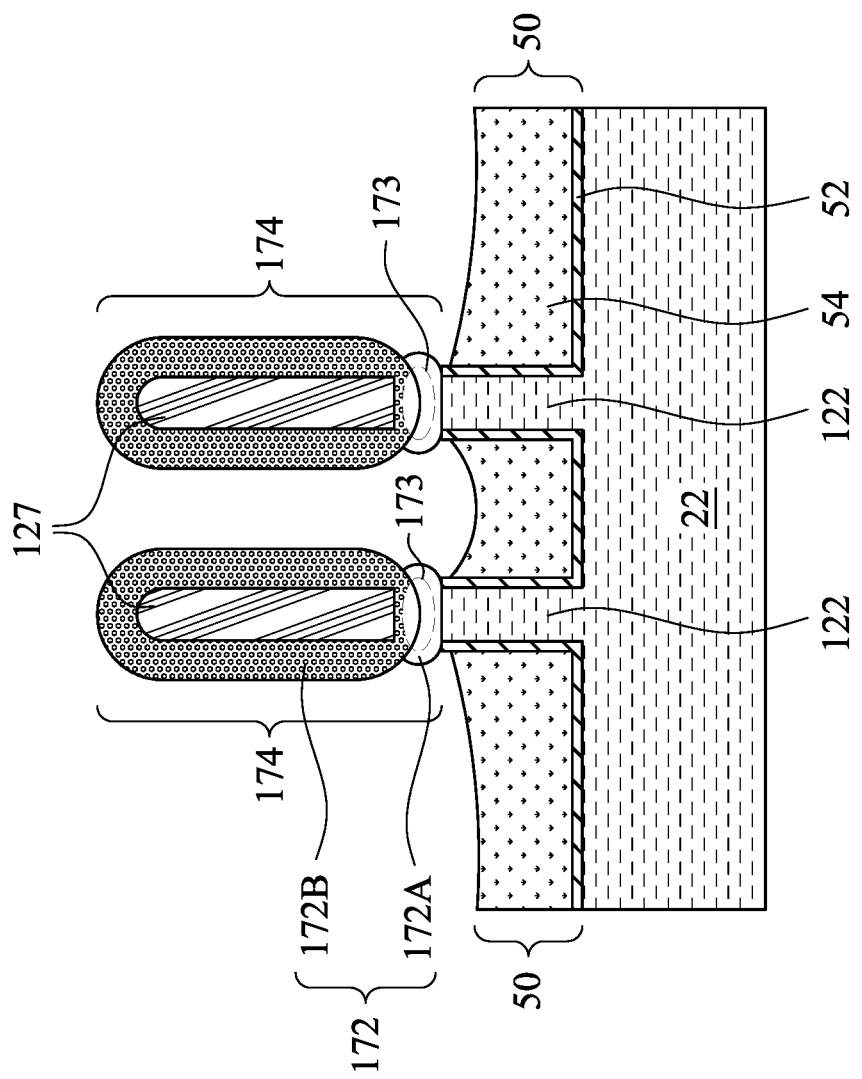

Next, epitaxy regions 172 and 272 are formed by selectively growing semiconductor materials on protruding fins 156 and 256, respectively, resulting in the structure in FIGS. 13A and 13B. The respective step is shown as step 322 in the process flow shown in FIG. 18. Epitaxy regions 172 and 272 are epitaxially grown in different epitaxy processes, with each including forming a mask layer (not shown) on one of the epitaxy regions 172 and 272, so that the epitaxy regions may be formed on the other one of epitaxy regions 172 and 272. Depending on whether the resulting FinFET is a p-type FinFET or an n-type FinFET, a p-type or an n-type impurity may be in-situ doped with the proceeding of the epitaxy. For example, epitaxy regions 172 may be formed of silicon phosphorous (SiP) or silicon carbon phosphorous (SiCP), and epitaxy regions 272 may be formed of silicon germanium boron (SiGeB).

After the epitaxy step, epitaxy regions 172 and strip portions 127 may be further implanted with an n-type impurity to form source and drain regions 174 for the n-type FinFET. Epitaxy regions 272 and strip portions 234 may also be implanted with a p-type impurity to form source and drain regions 274 for the p-type FinFET. In accordance with alternative embodiments of the present disclosure, the implantation step is skipped when epitaxy regions 172 and 272 are in-situ doped with the p-type or n-type impurity during the epitaxy.

Due to the gaps 70 as shown in FIG. 12, during the epitaxy, the semiconductor material is grown simultaneously from both the top surface of strip portions 122 and the surfaces of strip portions 127. The portions of the semiconductor material grown from the top surfaces of strip portions 122 are denoted as epitaxy regions 172A. The portions of the semiconductor material grown from strip portions 127 are denoted as epitaxy regions 172B, which encircle the corresponding strip portions 127 in the cross-sectional view.

Epitaxy regions 172A and 172B have the same composition, which means they are formed of the same semiconductor material such as silicon, SiP, or SiCP, or the like, and the atomic and weight percentages of the corresponding elements in epitaxy regions 172A and 172B are the same as each other. Epitaxy regions 172A and 172B may also be formed of other semiconductor material having a lattice constant smaller than the lattice constant of strip portions 127, so that a tensile stress may be applied by epitaxy regions 172A and 172B. For example, III-V compound semiconductor materials with the lattice constant smaller than the lattice constant of strip portions 127 may be used. On the other hand, strip portions 122 and 127 have different surface structures. For example, strip portions 122 may have (100) top surface orientation, while strip portions 127 may have (110) or (100) R45 top surface orientation. Accordingly, epitaxy regions 172A and 172B have different surface structures, and epitaxy regions 172A have the same surface structure as that of strip portions 122, and epitaxy regions 172B have the same surface structure as that of strip portions 127. Epitaxy regions 172A eventually merge with the corresponding overlying epitaxy regions 172B to form epitaxy regions 172. The interfaces between epitaxy regions 172A and the corresponding epitaxy regions 172B may be higher than the top surfaces of STI regions 50. FIG. 13B illustrates a cross-sectional view of epitaxy regions 172A and 172B as shown in FIG. 13A.

In the exemplary embodiments as shown in FIGS. 13A and 13B, epitaxy regions 172A and 172B have rounded outer sidewalls. It is realized that the shapes of epitaxy regions 172A and 172B are affected by various factors such as the material, the shape of strip portions 127, the top surface shape of strip portions 122, etc. Accordingly, the sidewalls of either one of epitaxy regions 172A and 172B may be rounded (continuously curved), or faceted (with straight portions as in the plane shown in FIG. 13B). Also, the interface between epitaxy regions 172A and 172B may have different shapes including, and not limited to, a straight interface, a curved interface (as shown in FIG. 13B), or include several straight sections. For example, the outer perimeter of epitaxy regions 172B may have an elongated hexagonal shape, with the vertical edges perpendicular to the top surface of the respect wafer being greater that other sides.

Voids (which may be vacuum gaps or air gaps) 173 may also be formed when the growth rate of the portions of epitaxy regions 172A and 172B directly over the centers of strip portions 122 is lower than the growth rates of their corresponding left portions and right portions (as in FIG. 13B). Voids 173 may have different shapes depending on the differences in the growth rates.

The merging of epitaxy regions 172A with epitaxy regions 172B is advantageous. Since different types of devices on the same wafer/die would share formation process as much as possible to reduce the manufacturing cost, the process for forming the FinFETs may also be used to form diodes and passive devices such as pickup regions of substrate regions. These devices need to have their regions that are formed simultaneously as source/drain regions 174 and 274 to be connected to substrate 22. In accordance with some embodiments of the present disclosure, by removing strip portions 124, so that epitaxy regions 172A and 172B can be merged, the diodes and passive devices can be connected to substrate 22. Accordingly, it is feasible to share the process steps for forming the illustrated FinFETs with the formation of other devices such as diodes and passive devices. In accordance with alternative embodiments, dielectric strip portions 124 are not etched, the FinFETs will have reduced source/drain leakage in accordance with these embodiments.

Although FIGS. 13A and 13B illustrate that source/drain regions 174 are separated from each other, and source/drain regions 274 are separated from each other, it is realized that depending on how long the epitaxy processes last, source/drain regions 174 may be merged with each other or remain separated from each other, and source/drain regions 274 may be merged with each other or remain separated from each other. Also, the shapes of the epitaxy regions 172 and 272 may be similar to what is shown, or have other shapes such as spade/diamond shapes. Air gaps may be formed directly underlying the merged portions of epitaxy regions 172, and/or directly underlying the merged portions of epitaxy regions 272.

Figure 14:
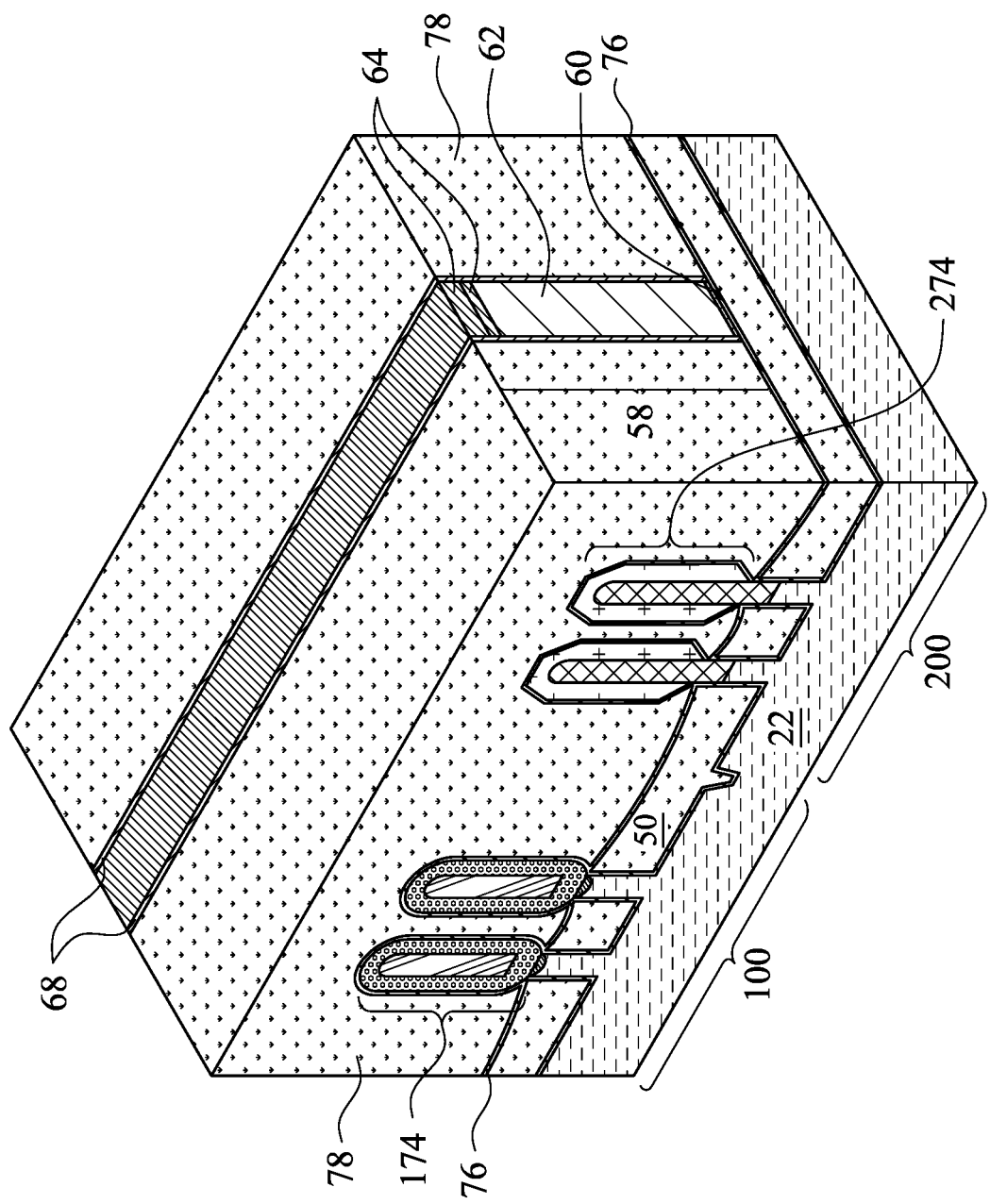

FIG. 14 illustrates a perspective view of the structure with Contact Etch Stop Layer (CESL) 76 and Inter-Layer Dielectric (ILD) 78 being formed. The respective step is shown as step 324 in the process flow shown in FIG. 18. CESL 76 may be formed of silicon nitride, silicon carbo-nitride, or the like. CESL 76 may be formed using a conformal deposition method such as ALD, for example. ILD 78 may include a dielectric material formed using, for example, FCVD, spin-on coating, CVD, or other deposition methods. ILD 78 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as CMP or mechanical grinding may be performed to level the top surfaces of ILD 78, dummy gate stack 58, and gate spacers 68 with each other.

Next, dummy gate stack 58, which include hard mask layer 64, dummy gate electrode 62 and dummy gate dielectric 60, is replaced with replacement gate stack 84, which include metal gates 82 and replacement gate dielectrics 80 as shown in FIGS. 15A, 15B, 15C, 15D, 15E, and 15F. In the removal of dummy gate stacks 58, dielectric strip portions 124 (FIG. 9) that were previously buried under the dummy gate stacks are exposed, and are at least recessed laterally due to the similarity of its material to the material of the dummy gate dielectric. In accordance with some embodiments of the present disclosure, an additional etching process, which may be a wet etching process, is further performed after the removal of the dummy gate stack if the material of strip portions 124 is different from that of STI regions 50, so that strip portions 124 are removed without damaging STI regions 50.

When replacing gate stacks, hard mask layers 64, dummy gate electrodes 62 and dummy gate dielectrics 60 (FIG. 14) are first removed in one or a plurality of etching steps, resulting in a trench (opening) to be formed between gate spacers 68. In the formation of the replacement gates, gate dielectric layer 80 (FIG. 15A) is first formed, which extends into the recess left by the removed dummy gate stack, and may have a portion extending over ILD 78. In accordance with some embodiments of the present disclosure, gate dielectric 80 includes an Interfacial Layer (IL, not shown separately) as its lower part. The IL may include an oxide layer such as a silicon oxide layer, which is formed through a chemical oxidation process or a deposition process. Gate dielectric 80 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in gate dielectric 80 is formed using ALD or CVD.

Gate electrode 82 is formed over gate dielectric 80 and filling the remaining portion of the recess. The formation of gate electrode 82 may include a plurality of deposition processes to deposit a plurality of conductive layers, and performing a planarization step to remove the excess portions of the conductive layers over ILD 78. The deposition of the conductive layers may be performed using conformal deposition methods such as ALD or CVD.

Gate electrode 82 may include a diffusion barrier layer and one (or more) work-function layer over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type FinFET in device region 100, the work-function layer may include a TaN layer and a titanium aluminum (TiAl) layer over the TaN layer. For the p-type FinFET in device region 200, the work-function layer may include a TaN layer, a TiN layer over the TaN layer, and a TiAl layer over the TiN layer. After the deposition of the work-function layer(s), another barrier layer, which may be another TiN layer, is formed. Gate electrode 82 may also include a filling metal, which may be formed of tungsten or cobalt, for example. After the formation of the replacement gate 84, replacement gate 84 is recessed, and dielectric hard mask 86 is filled into the recess.

Figure 15A:
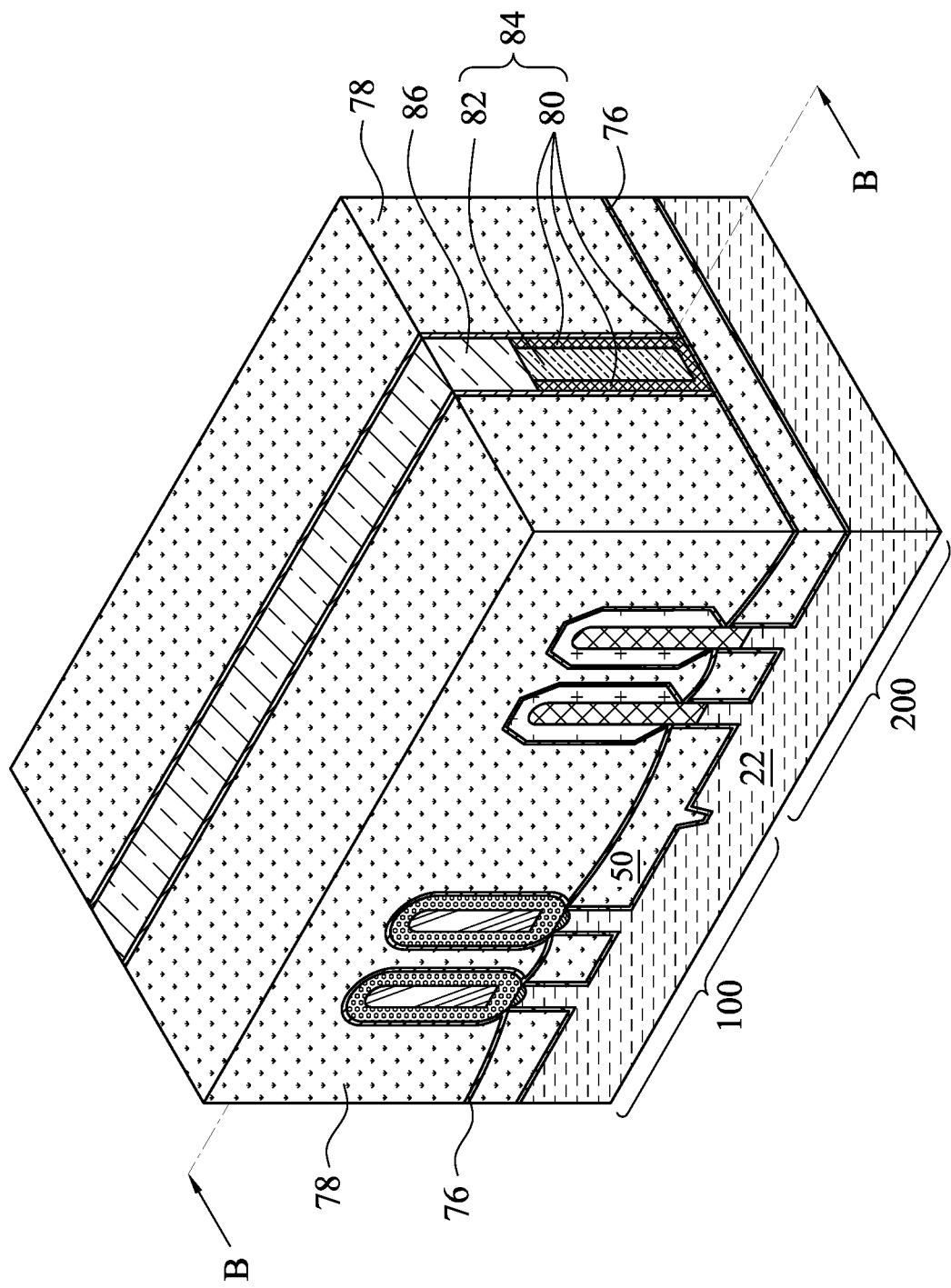
Figure 15B:
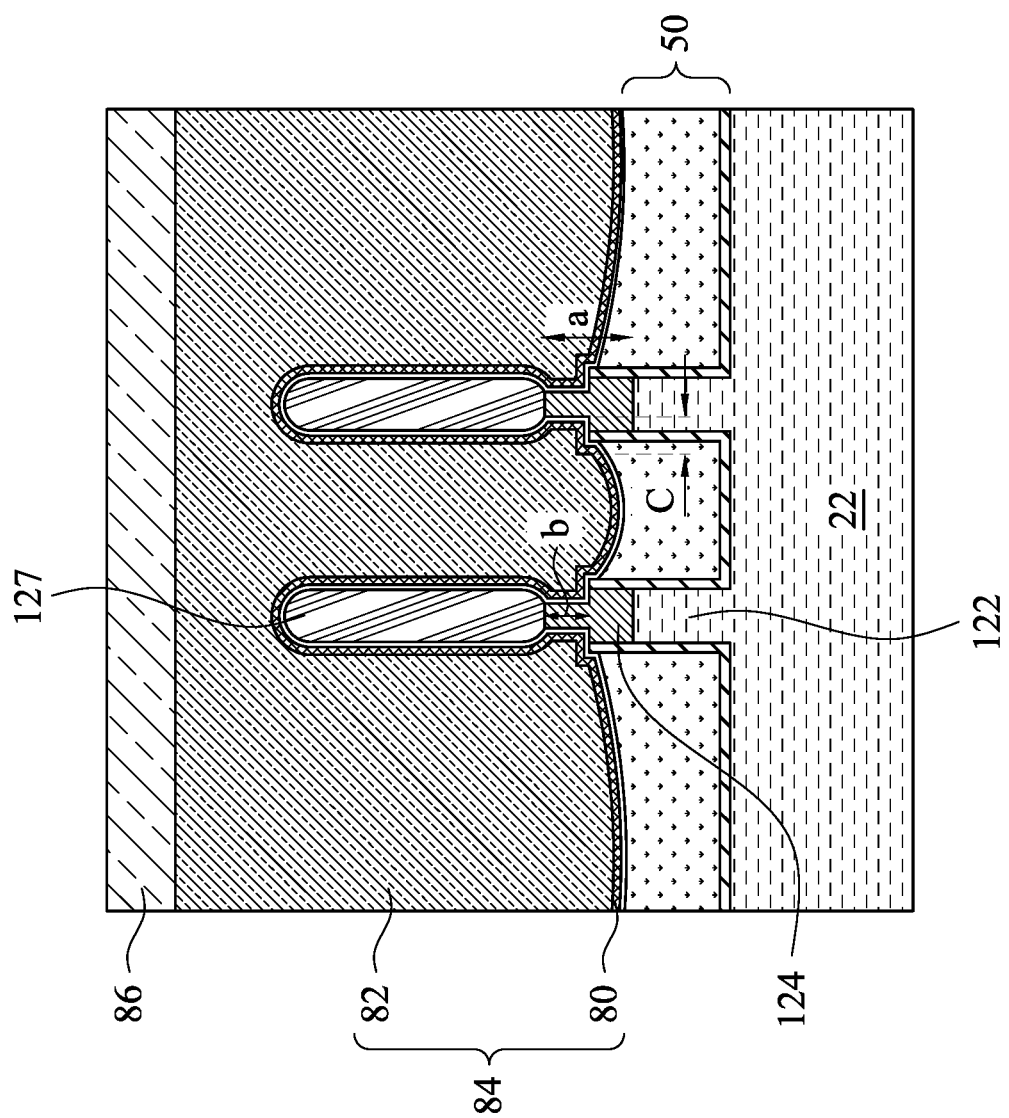
Figure 15C:
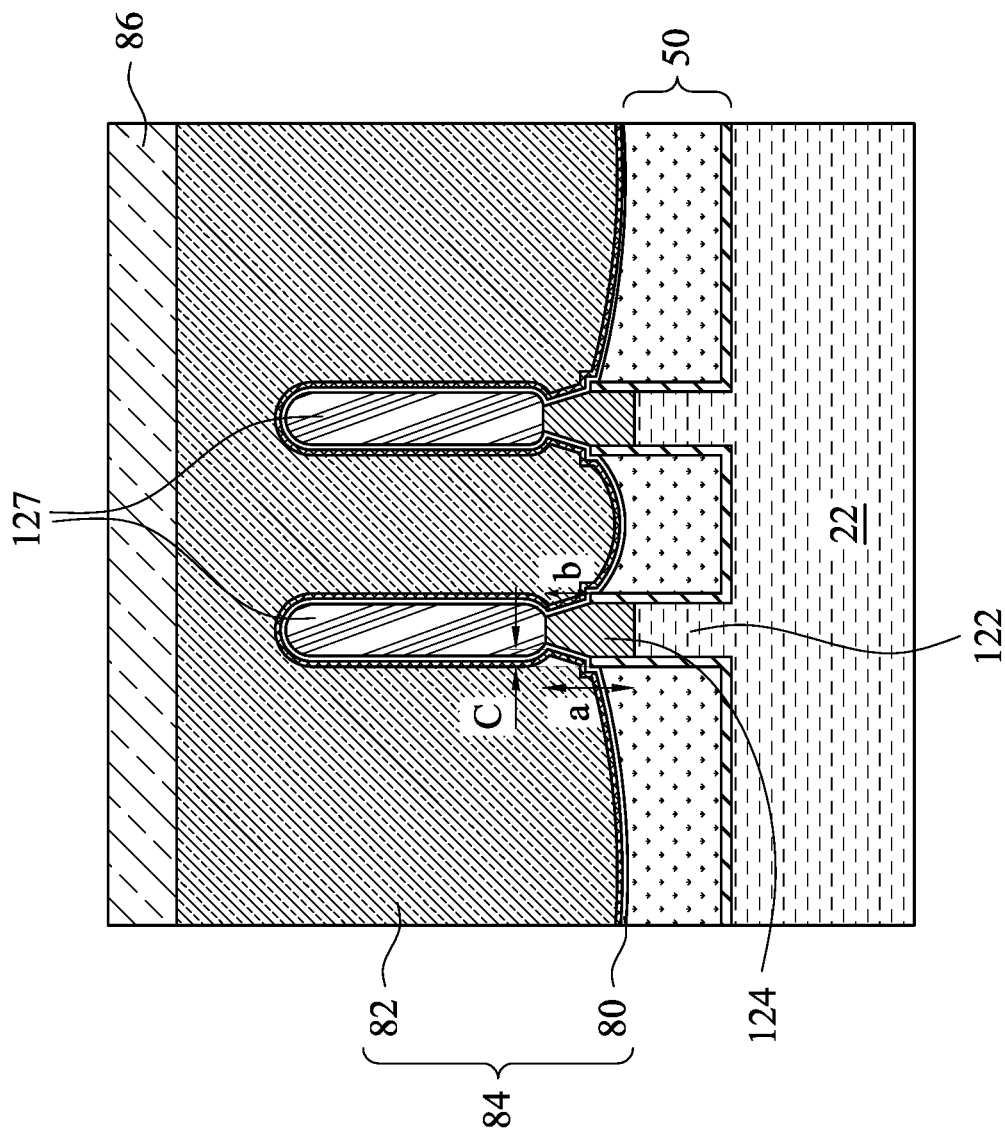
Figure 15D:
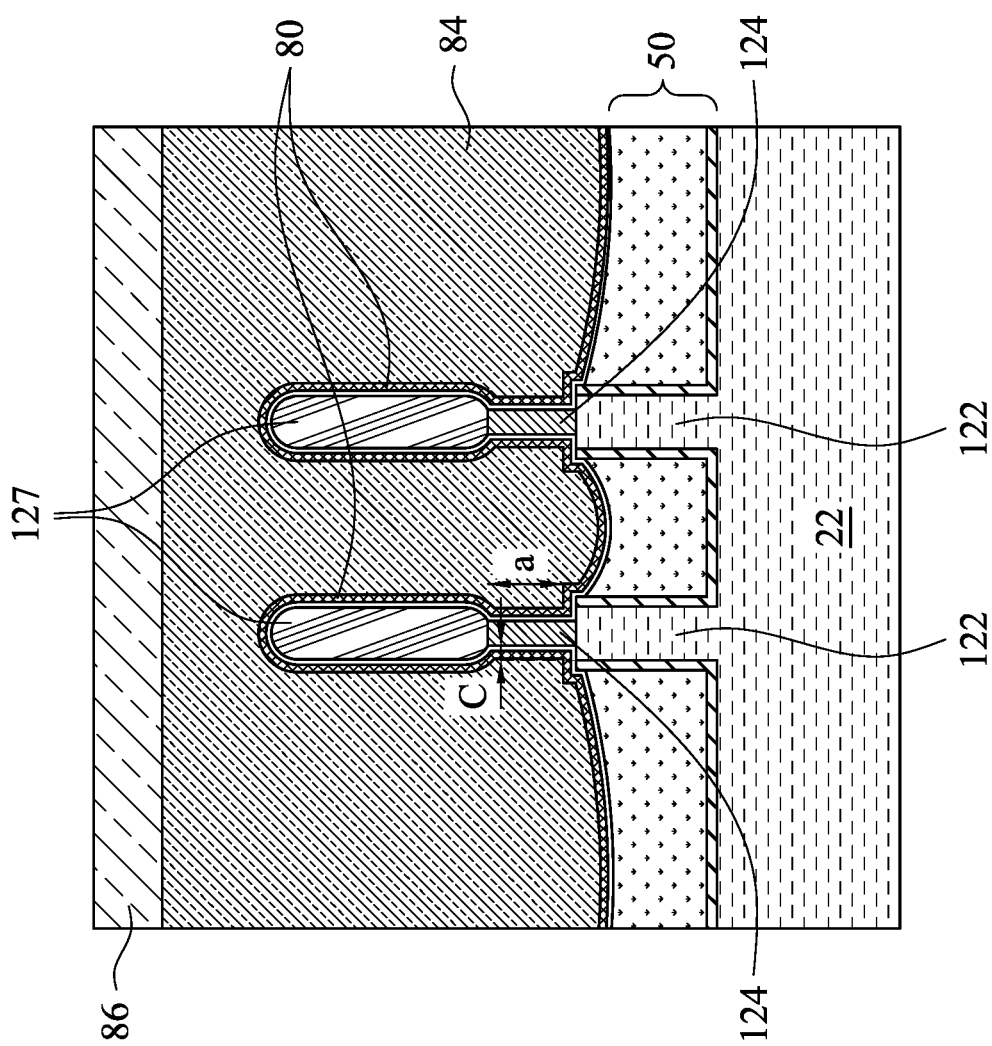
Figure 15E:
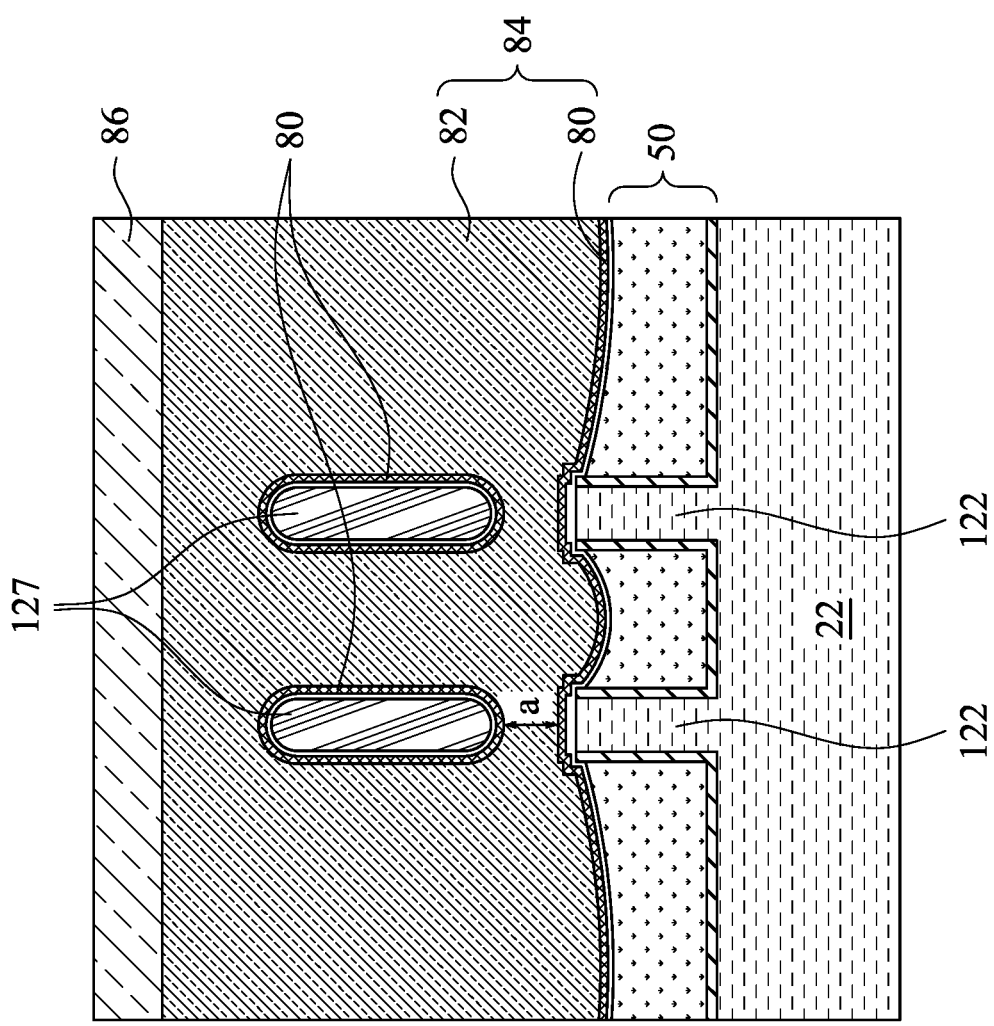

FIGS. 15B, 15C, 15D, and 15E illustrate a plurality of cross-sectional views of the replacement gate of n-type FinFET in device region 100, wherein the cross-sectional views are obtained from the vertical plane containing line B-B in FIG. 15A. Due to the lateral recessing of dielectric strip portions 124, the resulting gates may form Ω-gates or quad-gates. For example, FIG. 15B illustrates a Ω-gate, in which the top portions of dielectric strip portions 124 are recessed laterally, and the sidewalls of the recessed portions of dielectric strip portions 124 are substantially vertical. FIG. 15C illustrates another Ω-gate, in which the top portions of dielectric strip portions 124 are recessed laterally, and the sidewalls of the recessed portions of dielectric strip portions 124 are slanted, and may be substantially straight. FIG. 15D illustrates a Ω-gate, in which an entirety of dielectric strip portions 124 is recessed laterally, and the sidewalls of dielectric strip portions 124 are substantially vertical. FIG. 15E illustrates a quad-gate, in which dielectric strip portions 124 (refer to FIG. 15D as a reference) are fully removed. The resulting gate stack 84 includes four portions (hence the name quad-gate) contacting the top surface, the bottom surface, the left sidewall, and the right sidewall of fin portions 127. With the formation of the Ω-gate or the quad-gate, the short-channel control of the FinFETs is improved. In FIGS. 15B, 15C, 15D, and 15E, fin portions 127 form the channel regions of the FinFETs.

In accordance with some embodiments of the present disclosure, the height of dielectric strip portions 124 is in the range between about 5 nm and about 15 nm. The height b (FIGS. 15B and 15C) of the necking portions of dielectric strip portions 124 is in the range between about 3 nm and about 15 nm. The lateral recessing distance c (FIGS. 15B, 15C, and 25D) of the necking portions of dielectric strip portions 124 is in the range between about 1 nm and about 3 nm.

Figure 15F:
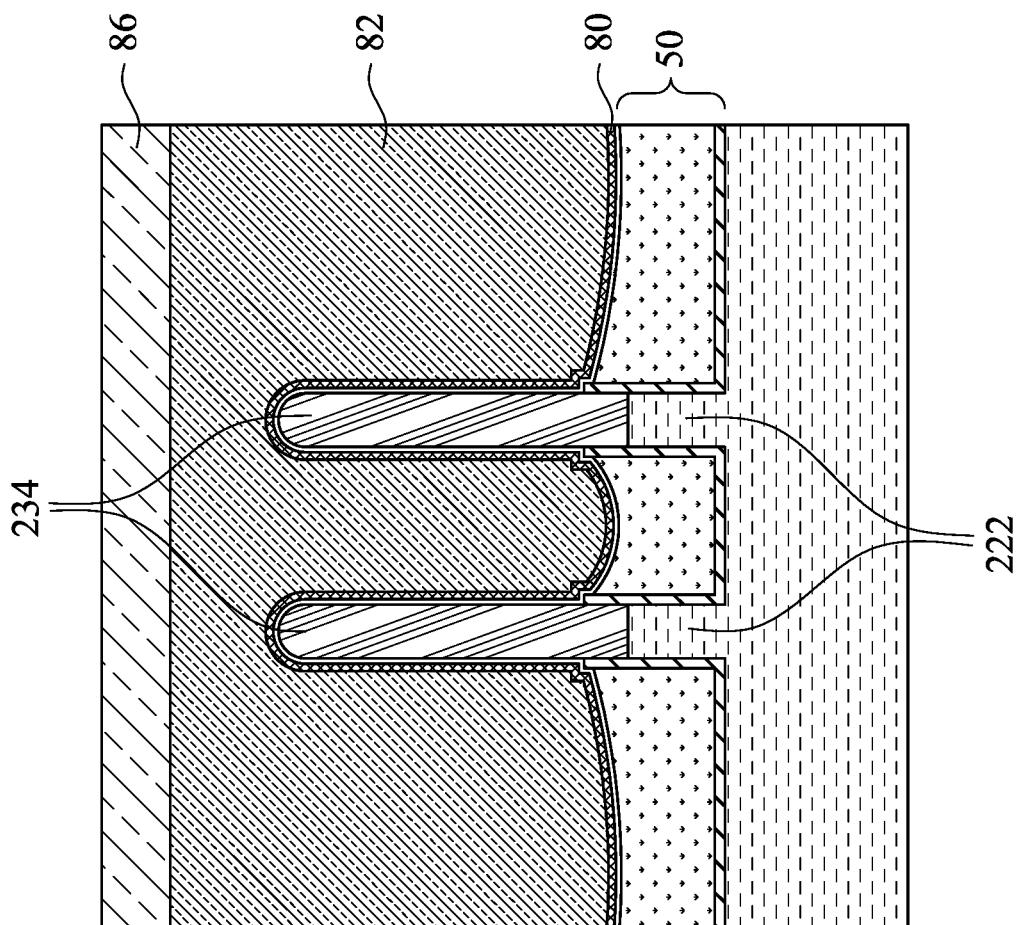

FIG. 15F illustrates a cross-sectional view of the replacement gate of the p-type FinFET in device region 200. Fin portions 234 form the channel regions of the FinFET.

Figure 16:
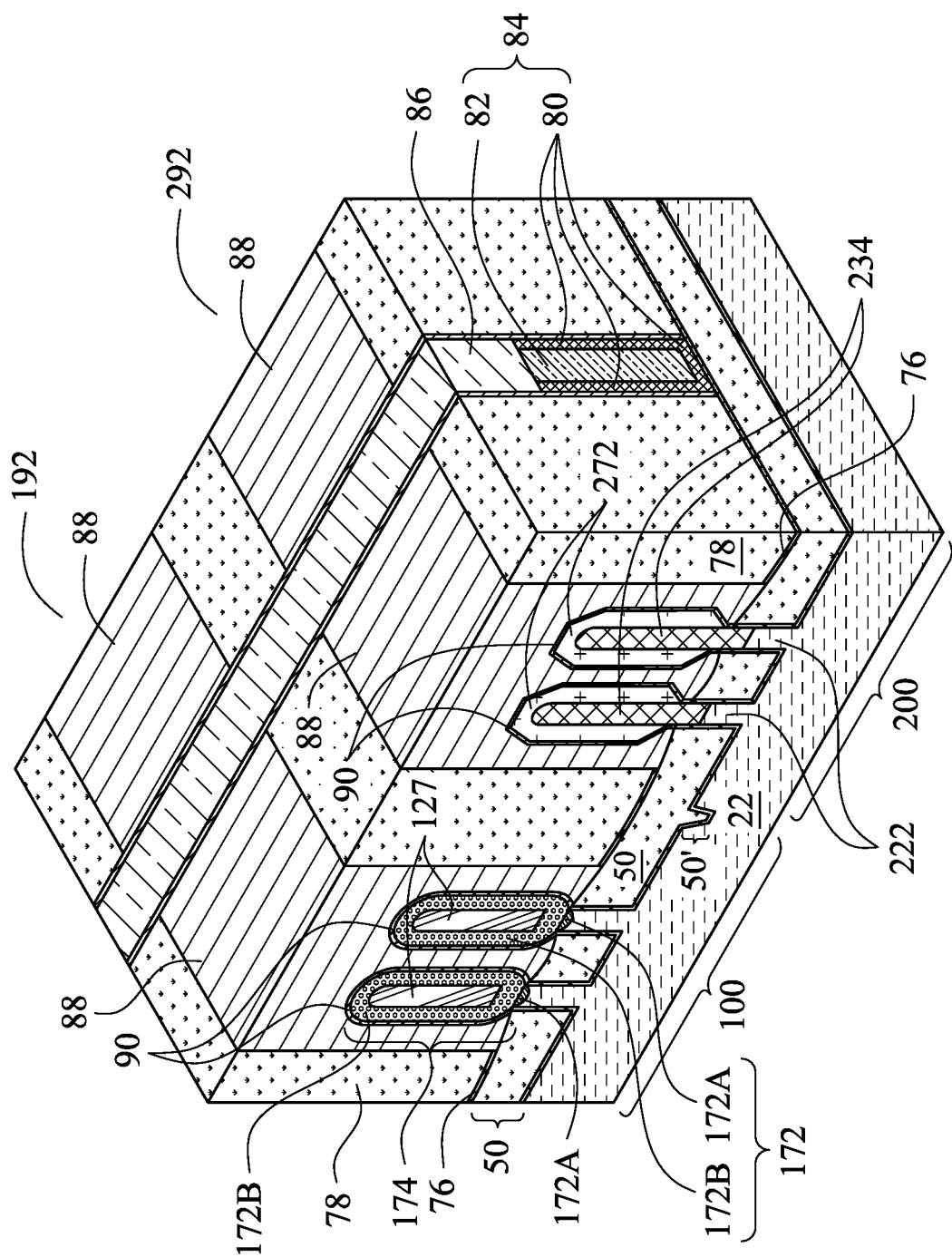

After the structure as shown in FIG. 15A is formed, ILD 78 and CESL 76 are etched to form contact openings. The etching may be performed using, for example, Reactive Ion Etch (RIE). In a subsequent step, as shown in FIG. 16, source/drain contact plugs 88 are formed. The respective step is also shown as step 324 in the process flow shown in FIG. 18. Before forming contact plugs 88, the portions of CESL 76 exposed to the contact opens are first etched, revealing epitaxy regions 172 and 272. Silicide regions 90 are then formed on epitaxy regions 172 and 272. In accordance with some embodiments of the present disclosure, contact plugs 88 include barrier layers and a metal-containing material over the respective barrier layers. In accordance with some embodiments of the present disclosure, the formation of contact plugs 88 includes forming a blanket barrier layer and a metal-containing material over the blanket barrier layer, and performing a planarization to remove excess portions of the blanket barrier layer and the metal-containing material. The barrier layer may be formed of a metal nitride such as titanium nitride or tantalum nitride. The metal-containing material may be formed of tungsten, cobalt, copper, or the like. N-type FinFET and 192 and p-type FinFET 292 are thus formed.

Figure 17A:
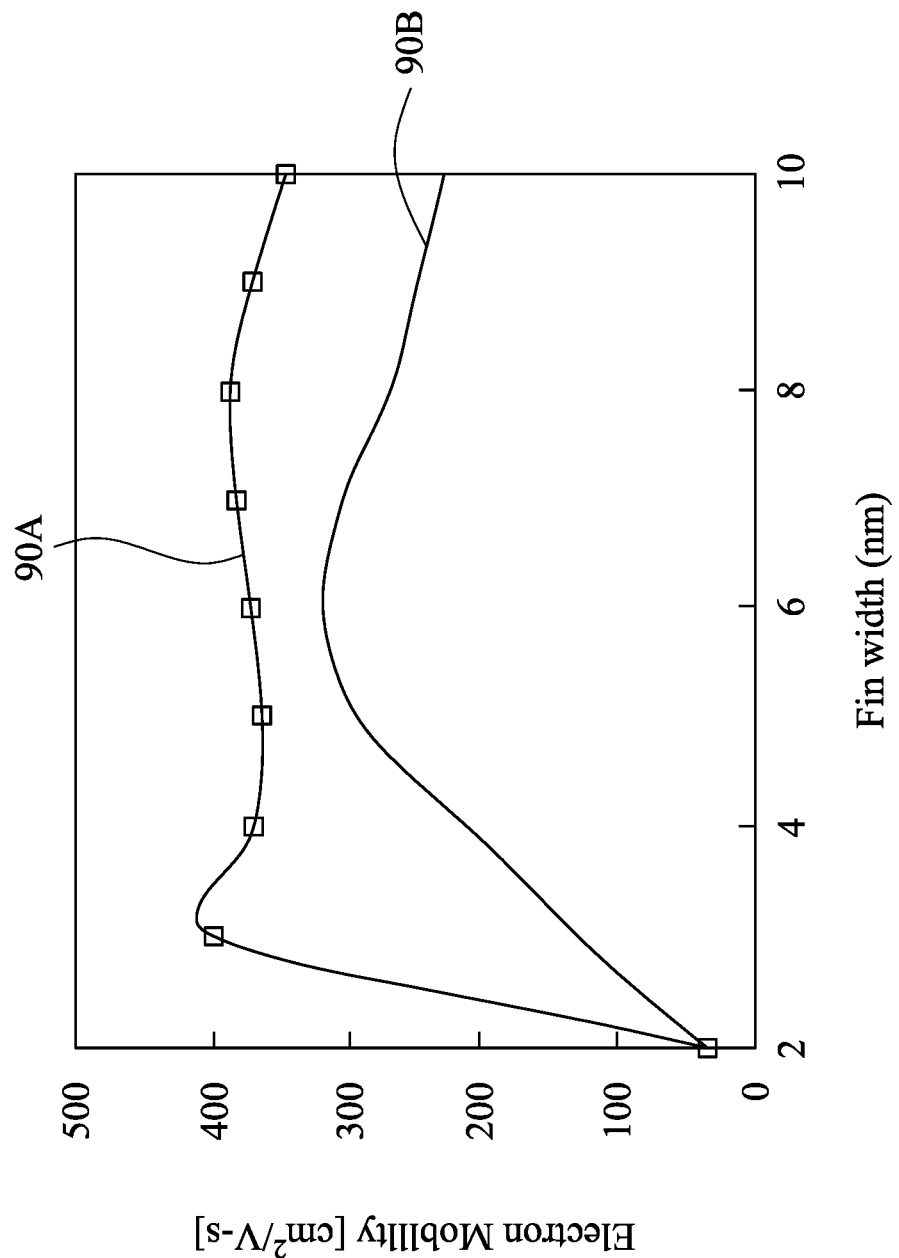
FIG. 17A illustrates the mobility of electrons as a function of fin widths in accordance with some embodiments.

FIG. 17A illustrates the electron mobility as a function of the widths (for example, refer to width W1 and W2 in FIG. 7B) of the semiconductor fins of n-type FinFETs. Line 90A illustrates both the results obtained from the (110) wafer (with sidewalls of the fins on (100) planes) and (100) R45 wafers. It is illustrated that when the widths of the fins is smaller than about 3 nm, the electron mobility is low, and the electron mobility is high when the width is higher than about 3 nm. Accordingly, the FinFETs formed based on the fin widths greater than about 3 nm may have good performance. As a comparison, with a (110) wafer (with both the top surfaces and the sidewalls of the fins on (110) planes), as shown by line 90B, the electron mobility is much lower than line 90A, and the electron mobility does not increase until the fin width is increased to about 6 nm. The results indicate that n-type FinFETs formed on (100) R45 and (110) wafers have good performance.

Figure 17B:
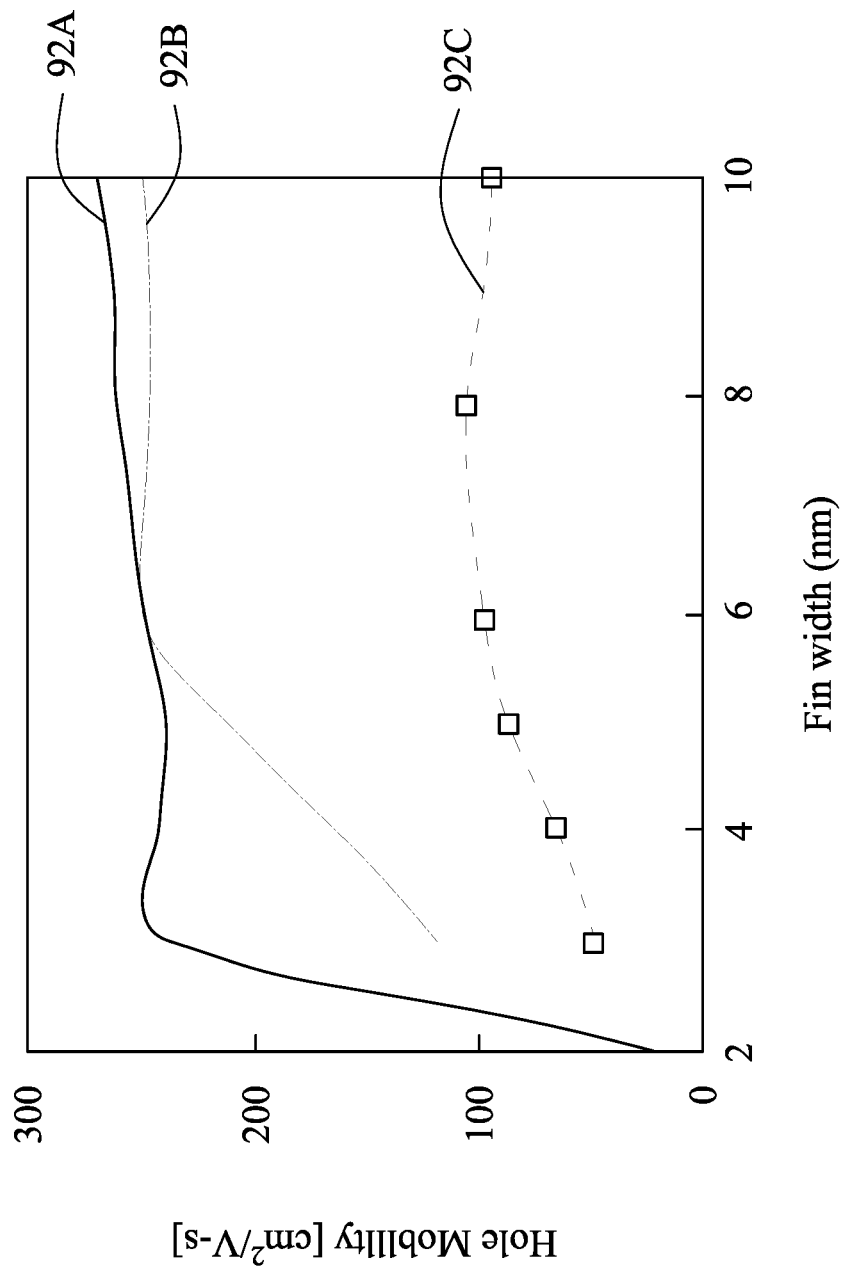
FIG. 17B illustrates the mobility of holes as a function of fin widths in accordance with some embodiments.

FIG. 17B illustrates the hole mobility as a function of the widths (for example, refer to width W1 and W2 in FIG. 7B) of the semiconductor fins of p-type FinFETs. Line 92A illustrates the results obtained from a wafer with the top surfaces of fins on (100) plane, and sidewalls of fins on (110) plane. Line 92B illustrates the results obtained from a wafer with both the top surfaces and sidewall surfaces of fins on (110) planes. Line 92C illustrates the results obtained from a wafer with both the top surfaces and sidewall surfaces of fins on (100) planes. The results indicate that line 92A has better results than lines 92B and 92C. Accordingly, the results shown in FIGS. 17A and 17B in combination indicate that n-type FinFETs on (100) R45 or (110) top surfaces have good performance, and p-type FinFETs on (100) top surfaces have good performance. The performance of both n-type FinFETs and p-type FinFETs is thus improved when formed on the hybrid substrates in accordance with the embodiments of the present disclosure.

The embodiments of the present disclosure have some advantageous features. By forming n-type FinFETs and p-type FinFETs starting from a hybrid substrate, the performance of both n-type FinFETs and p-type FinFETs is improved. The removal of the spacer that separates the n-type and p-type device regions advantageously eliminates the defects caused by the collapsing of the spacer.

In accordance with some embodiments of the present disclosure, a method includes etching a hybrid substrate to form a recess extending into the hybrid substrate. The hybrid substrate includes a first semiconductor layer having a first surface orientation, a dielectric layer over the first semiconductor layer, and a second semiconductor layer having a second surface orientation different from the first surface orientation. After the etching, a top surface of the first semiconductor layer is exposed to the recess. A spacer is formed on a sidewall of the recess. The spacer contacts a sidewall of the dielectric layer and a sidewall of the second semiconductor layer. An epitaxy is performed to grow an epitaxy semiconductor region from the first semiconductor layer. The spacer is removed. In an embodiment, after the spacer is removed, performing a first patterning step, wherein the second semiconductor layer, the dielectric layer, and the first semiconductor layer are patterned to form a first semiconductor strip by the first patterning step. In an embodiment, when the first patterning step is performed, simultaneously performing a second patterning step, wherein the epitaxy semiconductor region and the first semiconductor layer are patterned to form a second semiconductor strip. In an embodiment, during the first patterning step, a portion of the first semiconductor layer directly underlying the removed spacer is recessed to form a notch extending down from top surfaces of the first semiconductor layer, and the top surfaces of the first semiconductor layer extend to opposite sides of the notch. In an embodiment, the method further includes forming isolation regions on opposite sides of the first semiconductor strip; recessing the isolation regions, with a top portion of the first semiconductor strip protruding higher than top surfaces of remaining portions of the isolation regions to form a fin; and forming a Fin Field-Effect Transistor (FinFET) based on the fin. In an embodiment, the removing the spacer is performed in a wet etching step. In an embodiment, after the removing the spacer, a gap is formed to separate the epitaxy semiconductor region from a remaining portion of the dielectric layer and the second semiconductor layer.

In accordance with some embodiments of the present disclosure, a method includes etching a hybrid substrate to form a recess, wherein the recess penetrates through an upper semiconductor layer and a dielectric layer, with a top surface of a lower semiconductor layer underlying the dielectric layer exposed to the recess; forming a vertical spacer on a sidewall of the recess; performing an epitaxy to grow an epitaxy semiconductor region from the lower semiconductor layer; etching the vertical spacer so that the epitaxy semiconductor region is spaced apart from the upper semiconductor layer and the dielectric layer by a gap; and performing a patterning step to form a first strip and a second strip, wherein the first strip comprises a portion of the upper semiconductor layer, a portion of the dielectric layer, and a portion of the lower semiconductor layer, and the second strip comprises a portion of the epitaxy semiconductor region. In an embodiment, the method further includes after the etching the vertical spacer and before the patterning step, depositing a silicon layer over the upper semiconductor layer and the epitaxy semiconductor region. In an embodiment, the method further includes forming isolation regions on opposite sides of each of the first strip and the second strip; and recessing the isolation regions, with top portions of the first strip and the second strip protruding higher than top surfaces of remaining portions of the isolation regions to form a first fin and a second fin, respectively. In an embodiment, the method further includes etching the portion of the dielectric layer in the first strip to separate the portion of the upper semiconductor layer in the first strip from the portion of the lower semiconductor layer in the first strip. In an embodiment, the method further includes performing an epitaxy to grow an additional semiconductor material, wherein the additional semiconductor material comprises: a first portion grown from the portion of the upper semiconductor layer in the first strip; and a second portion grown from the portion of the lower semiconductor layer in the first strip, wherein the first portion and the second portion of the additional semiconductor material have different top surface orientations, and are merged with each other. In an embodiment, the patterning step results in a gap formed between the first strip and the second strip, with a top surface of the lower semiconductor layer directly under and exposed to the recess, and a notch is formed to extend down from the top surface of the lower semiconductor layer into the lower semiconductor layer. In an embodiment, the notch is at a location directly underlying the etched vertical spacer.

In accordance with some embodiments of the present disclosure, a device includes a bulk semiconductor layer having a first top surface orientation; a first semiconductor strip and a second semiconductor strip over and connected to the bulk semiconductor layer, wherein the first semiconductor strip and the second semiconductor strip have different top surface orientations; an isolation region between the first semiconductor strip and the second semiconductor strip, the isolation region comprising a protruding portion protruding down from bottom surfaces of the isolation region, with the bottom surfaces being on opposite sides of the protruding portion of the isolation region; a first source/drain region overlapping the first semiconductor strip, wherein the first source/drain region is a portion of an n-type FinFET; and a second source/drain region overlapping the second semiconductor strip, wherein the second source/drain region is a portion of a p-type FinFET. In an embodiment, the second source/drain region has the first top surface orientation, and the first source/drain region has a second top surface orientation different from the first top surface orientation. In an embodiment, the first source/drain region has a (110) top surface orientation, and the second source/drain region has a (100) top surface orientation. In an embodiment, the first source/drain region has a (100) R45 top surface orientation, and the second source/drain region has a (100) top surface orientation. In an embodiment, the first source/drain region comprises: an upper portion and a lower portion, wherein the upper portion and the lower portion have different top surface orientations, wherein a joint of the upper portion and the lower portion is higher than a top surface of the isolation region. In an embodiment, the protruding portion of the isolation region is in middle between the first semiconductor strip and the second semiconductor strip.

In accordance with some embodiments of the present disclosure, a method includes forming a vertical spacer to separate a first semiconductor region and a second semiconductor region; etching the vertical spacer to form a gap between the first semiconductor region and the second semiconductor region; forming a first mask and a second mask overlapping the first semiconductor region and the second semiconductor region, respectively; and using the first mask and the second mask as an etching mask to etch the first semiconductor region and the second semiconductor region, wherein remaining portions of the first semiconductor region and the second semiconductor region form portions of a first strip and a second strip, respectively, with the first strip and the second strip separated apart by a recess, and a notch is formed extending from the recess down into an underlying semiconductor layer. In an embodiment, the method further includes forming the first semiconductor region comprising: performing an epitaxy on a hybrid substrate, wherein the hybrid substrate comprises a first semiconductor layer, a dielectric layer over the first semiconductor layer, and a second semiconductor layer over the dielectric layer, wherein in the epitaxy, an additional semiconductor layer is grown from the first semiconductor layer. In an embodiment, the method further includes forming the second semiconductor region comprising: etching a semiconductor layer and a dielectric layer underlying the semiconductor layer to form a recess; and epitaxially grown the second semiconductor region from the recess. In an embodiment, the method further includes forming an n-type FinFET and a p-type FinFET based on the first strip and the second strip, respectively.

In accordance with some embodiments of the present disclosure, a device includes an n-type FinFET including a first semiconductor material forming a first channel of the n-type FinFET; and a first semiconductor strip overlapped by the first semiconductor material; a p-type FinFET comprising: a second semiconductor material forming a second channel of the p-type FinFET, wherein the first semiconductor material and the second semiconductor material have different top surface orientations; and a second semiconductor strip overlapped by the second semiconductor material; and an STI region between and contacting the first semiconductor strip and the second semiconductor strip, wherein the STI region comprises a protruding portion in a middle of the first semiconductor strip and the second semiconductor strip, and the protruding portion extends lower than opposite bottom surfaces of the STI region. In an embodiment, the first semiconductor strip and the second semiconductor strip have a same top surface orientation as the second semiconductor material. In an embodiment, the first semiconductor strip and the second semiconductor strip have a different top surface orientation than the first semiconductor material.

In accordance with some embodiments of the present disclosure, a device includes an n-type FinFET comprising: a first semiconductor strip; a first semiconductor fin overlapping the first semiconductor strip; and a first gate stack overlying a portion of the first semiconductor fin; a p-type FinFET comprising: a second semiconductor strip; a second semiconductor fin overlapping the second semiconductor strip; and a second gate stack overlying a portion of the first semiconductor fin; and an STI region between the first semiconductor strip and the second semiconductor strip, wherein the STI region comprises a protruding portion protruding downward from a bulk portion of the STI region, and in a top view of the device, the protruding portion has a lengthwise direction parallel to lengthwise directions of the first semiconductor strip and the second semiconductor strip. In an embodiment, the first semiconductor strip and the second semiconductor strip have a same top surface orientation as the second semiconductor fin, and the first semiconductor strip and the second semiconductor strip have a different top surface orientation than the first semiconductor fin. In an embodiment, the protruding portion has a height between about 5 nm and about 40 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a bulk semiconductor layer having a first top surface orientation;
   a first semiconductor strip and a second semiconductor strip over and connected to the bulk semiconductor layer;
   an isolation region between the first semiconductor strip and the second semiconductor strip, the isolation region comprising a protruding portion protruding down from bottom surfaces of the isolation region, with the bottom surfaces being on opposite sides of the protruding portion of the isolation region;
   a first source/drain region overlapping the first semiconductor strip, wherein the first source/drain region is a portion of an n-type Fin Field-Effect Transistor (FinFET), and the first source/drain region has a second top surface orientation different from the first top surface orientation; and
   a second source/drain region overlapping the second semiconductor strip, wherein the second source/drain region is a portion of a p-type FinFET, and the second source/drain region has the first top surface orientation.

2. The device of claim 1, wherein the first source/drain region has a (110) top surface orientation, and the second source/drain region has a (100) top surface orientation.

3. The device of claim 1, wherein the first source/drain region has a (100) R45 top surface orientation, and the second source/drain region has a (100) top surface orientation.

4. The device of claim 1, wherein the first source/drain region comprises:
   an upper portion and a lower portion, wherein the upper portion and the lower portion have different top surface orientations, wherein a joint of the upper portion and the lower portion is higher than a top surface of the isolation region.

5. The device of claim 4, wherein the lower portion has the first top surface orientation, and the upper portion has a (110) top surface orientation or a (100) R45 top surface orientation.

6. The device of claim 1, wherein the protruding portion of the isolation region is in middle between the first semiconductor strip and the second semiconductor strip.

7. The device of claim 1, wherein the protruding portion has equal distances from the first source/drain region and the second source/drain region.

8. The device of claim 1, wherein the protruding portion of the isolation region has a tapered profile, with lower portions of the protruding portion being narrower than respective upper portions of the isolation region.

9. A device comprising:
   an n-type Fin Field-Effect Transistor (FinFET) comprising:
      a first semiconductor material forming a first channel of the n-type FinFET; and
      a first semiconductor strip overlapped by the first semiconductor material;
   a p-type FinFET comprising:
      a second semiconductor material forming a second channel of the p-type FinFET, wherein the first semiconductor material and the second semiconductor material have different top surface orientations; and
      a second semiconductor strip overlapped by the second semiconductor material; and
   a Shallow Trench Isolation (STI) region between and contacting the first semiconductor strip and the second semiconductor strip, wherein the STI region comprises a protruding portion in a middle of the first semiconductor strip and the second semiconductor strip, and the protruding portion extends lower than opposite bottom surfaces of the STI region.

10. The device of claim 9, wherein the first semiconductor strip and the second semiconductor strip have a same top surface orientation as the second semiconductor material.

11. The device of claim 9, wherein the first semiconductor strip and the second semiconductor strip have a different top surface orientation than the first semiconductor material.

12. The device of claim 9, wherein the first semiconductor material comprises an inner portion, and an outer portion encircling the inner portion in a cross-sectional view of the device, wherein the inner portion and the outer portion are formed of different semiconductor materials.

13. The device of claim 12, wherein the inner portion comprises silicon, and the outer portion comprises silicon carbon.

14. The device of claim 9, wherein the first semiconductor material and the first semiconductor strip have different surface orientations.

15. The device of claim 9, wherein the protruding portion of the STI region is elongated and has a lengthwise direction parallel to source-to-drain directions of the n-type FinFET and the p-type FinFET.

16. A device comprising:
   an n-type Fin Field-Effect Transistor (FinFET) comprising:
      a first semiconductor strip;

a first semiconductor fin overlapping the first semiconductor strip; and
a first gate stack overlying a portion of the first semiconductor fin;
a p-type FinFET comprising:
a second semiconductor strip;
a second semiconductor fin overlapping the second semiconductor strip; and
a second gate stack overlying a portion of the second semiconductor fin; and
a Shallow Trench Isolation (STI) region between the first semiconductor strip and the second semiconductor strip, wherein the STI region comprises a protruding portion protruding downward from a bulk portion of the STI region, and in a top view of the device, the protruding portion has a lengthwise direction parallel to lengthwise directions of the first semiconductor strip and the second semiconductor strip.

17. The device of claim 16, wherein the first semiconductor strip and the second semiconductor strip have a same top surface orientation as the second semiconductor fin, and the first semiconductor strip and the second semiconductor strip have a different top surface orientation than the first semiconductor fin.

18. The device of claim 16, wherein the protruding portion protrudes from a bottom surface of the bulk portion for a depth in a range between about 5 nm and about 40 nm.

19. The device of claim 16, wherein the first semiconductor strip and the first semiconductor fin have different surface orientations.

20. The device of claim 19, wherein the first semiconductor strip and the first semiconductor fin that have different surface orientations are in contact with each other.

* * * * *